United States Patent
Donders et al.

(10) Patent No.: US 8,149,379 B2
(45) Date of Patent: Apr. 3, 2012

(54) LITHOGRAPHIC APPARATUS AND DEVICE MANUFACTURING METHOD

(75) Inventors: Sjoerd Nicolaas Lambertus Donders, Vught (NL); Nicolaas Ten Kate, Almkerk (NL); Lucas Henricus Johannes Stevens, Eindhoven (NL); Ronald Van Der Ham, Maarheeze (NL); Michel Riepen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 546 days.

(21) Appl. No.: 12/292,961

(22) Filed: Dec. 1, 2008

(65) Prior Publication Data

US 2009/0161083 A1  Jun. 25, 2009

Related U.S. Application Data

(60) Provisional application No. 60/996,740, filed on Dec. 3, 2007, provisional application No. 61/006,027, filed on Dec. 14, 2007, provisional application No. 61/129,154, filed on Jun. 6, 2008.

(51) Int. Cl.
  *G03B 27/52* (2006.01)
  *G03B 27/32* (2006.01)
(52) U.S. Cl. ............................ 355/30; 355/77
(58) Field of Classification Search .............. 355/30
  See application file for complete search history.

(56) References Cited

U.S. PATENT DOCUMENTS

| | | | |
|---|---|---|---|
| 4,283,730 A * | 8/1981 | Graf | ................. 347/82 |
| 4,509,852 A | 4/1985 | Tabarelli et al. | |
| 6,949,176 B2 * | 9/2005 | Vacca et al. | ................. 204/547 |
| 7,050,146 B2 | 5/2006 | Duineveld et al. | |
| 7,125,652 B2 | 10/2006 | Lyons et al. | |
| 7,317,504 B2 | 1/2008 | De Smit et al. | |
| 7,339,650 B2 | 3/2008 | Coon et al. | |
| 7,692,761 B2 | 4/2010 | Harayama | |
| 7,701,550 B2 | 4/2010 | Kemper et al. | |
| 7,705,962 B2 | 4/2010 | Kemper et al. | |
| 7,839,483 B2 | 11/2010 | Leenders et al. | |
| 2003/0205632 A1* | 11/2003 | Kim et al. | ................. 239/690 |
| 2004/0136494 A1 | 7/2004 | Lof et al. | |
| 2004/0160582 A1 | 8/2004 | Lof et al. | |
| 2004/0207824 A1 | 10/2004 | Lof et al. | |
| 2006/0023184 A1* | 2/2006 | Coon et al. | ................. 355/53 |
| 2006/0023187 A1 | 2/2006 | Eaton | |
| 2007/0109521 A1 | 5/2007 | Nishii et al. | |
| 2007/0146666 A1 | 6/2007 | Leenders et al. | |
| 2008/0002163 A1 | 1/2008 | Fujiwara et al. | |
| 2008/0117393 A1 | 5/2008 | Fujiwara et al. | |

(Continued)

FOREIGN PATENT DOCUMENTS

EP  1 420 300 A2  5/2004

(Continued)

OTHER PUBLICATIONS

Korean Office Action dated Oct. 27, 2010 in related Korean patent application No. 10-2008-0121261.

(Continued)

*Primary Examiner* — Edward Glick
*Assistant Examiner* — Michelle Iacoletti
(74) *Attorney, Agent, or Firm* — Pillsbury Winthrop Shaw Pittman LLP

(57) ABSTRACT

The use of electro wetting to control the behavior of immersion liquid within an immersion lithographic apparatus is disclosed.

19 Claims, 9 Drawing Sheets

U.S. PATENT DOCUMENTS

| | | |
|---|---|---|
| 2009/0075211 A1 | 3/2009 | Coon et al. |
| 2009/0075212 A1 | 3/2009 | Coon et al. |
| 2009/0134488 A1 | 5/2009 | Jansen et al. |
| 2010/0149514 A1 | 6/2010 | Kemper et al. |
| 2010/0157277 A1 | 6/2010 | Kemper et al. |
| 2011/0080574 A1 | 4/2011 | Nishii et al. |

FOREIGN PATENT DOCUMENTS

| | | |
|---|---|---|
| EP | 1 429 188 | 6/2004 |
| EP | 1 628 163 A2 | 2/2006 |
| JP | 2004-289127 | 10/2004 |
| JP | 2005-005713 | 1/2005 |
| JP | 2005-223342 | 8/2005 |
| JP | 2006-024819 | 1/2006 |
| JP | 2006-060223 | 3/2006 |
| JP | 2006-196905 | 7/2006 |
| JP | 2006-269940 | 10/2006 |
| JP | 2006-523022 | 10/2006 |
| JP | 2006-523026 | 10/2006 |
| JP | 2007-513518 | 5/2007 |
| JP | 2007-194613 | 8/2007 |
| JP | 2007-227580 | 9/2007 |
| JP | 2008-530789 | 8/2008 |
| JP | 2008-235620 | 10/2008 |
| JP | 2009-038301 | 2/2009 |
| WO | WO 99/49504 A1 | 9/1999 |
| WO | 2005/057636 | 6/2005 |
| WO | 2006/049134 | 5/2006 |
| WO | 2006/084641 | 8/2006 |

OTHER PUBLICATIONS

Japanese Office Action mailed Apr. 18, 2011 in corresponding Japanese Patent Application No. 2008-305944.

* cited by examiner

LITHOGRAPHIC APPARATUS AND DEVICE MANUFACTURING METHOD

This application claims priority and benefit under 35 U.S.C. §119(e) to U.S. Provisional Patent Application Ser. No. 60/996,740, entitled "Lithographic Apparatus and Device Manufacturing Method", filed on Dec. 3, 2007, to U.S. Provisional Patent Application Ser. No. 61/006,027, entitled "Lithographic Apparatus and Device Manufacturing Method", filed on Dec. 14, 2007, and U.S. Provisional Patent Application Ser. No. 61/129,154, entitled "Lithographic Apparatus and Device Manufacturing Method", filed on Jun. 6, 2008. The contents of those applications are incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is preferably distilled water, although other liquids can be used. An embodiment of the present invention will be described with reference to liquid. However, fluids may be suitable, particularly wetting fluids, incompressible fluids and/or fluids with higher refractive index than air, preferably a higher refractive index than water. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein or liquids with nano-particle suspensions (particles with maximum dimension up to 10 nm). Such particles may have similar or the same refractive index as the liquid in which they are suspended. Alternatively or additionally immersion liquids may include hydrocarbons, hydrofluorocarbons and aqueous solutions.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

An immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center and through which the projection is project. Liquid is supplied by one groove inlet IN on one side of the projection system PS and removed by a plurality of discrete outlets OUT on the other side of the projection system PL. This causes a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

In an immersion lithographic apparatus, droplets of immersion liquid may be unintentionally transferred to, or left behind on, a surface or a part of a surface where no immersion liquid is intended to be situated at a particular time. This may cause a problem which may result in a defective substrate being produced.

SUMMARY

It is desirable, for example, to reduce the formation of such unwanted droplets and/or to remove unwanted droplets of immersion liquid from one or more surfaces of an immersion lithographic apparatus.

According to an embodiment of the present invention, there is provided an immersion lithographic apparatus comprising: a surface that at least periodically is in contact with an immersion liquid; and an active immersion liquid control system, comprising: a first electrode, electrically connectable to immersion liquid to be controlled, a second electrode, associated with the surface and electrically isolated from the immersion liquid to be controlled, and a voltage controller, configured to provide a controlled voltage difference between the first and second electrodes.

According to an embodiment of the present invention, there is provided a device manufacturing method, comprising: supporting a substrate on a substrate table; projecting a patterned beam of radiation onto the substrate using a projection system; supplying immersion liquid, using an immersion system, to a space between a final element of the projection system and the substrate or substrate table; controlling immersion liquid on at least one surfaces selected from the following surfaces: a surface of the projection system, a surface of the substrate table and a surface of the immersion system, by applying a controlled voltage between a first electrode, electrically connected to the immersion liquid to be controlled, and a second electrode, associated with the surface and electrically isolated from the immersion liquid to be controlled.

According to an embodiment of the present invention, there is provided an immersion lithographic apparatus, comprising:

a substrate table configured to hold a substrate, wherein the substrate, the substrate table, or both the substrate and the substrate table, is coated with a layer of an electrically insulating material;

a projection system configured to project a patterned beam of radiation onto the substrate;

a barrier member configured to at least partly contain liquid in a space between the projection system and the substrate or substrate table, the barrier member configured such that there is a separation between the barrier member and the substrate or substrate table in which a meniscus, that surrounds the space, forms between the liquid and surrounding gas when the liquid is in the space, and the barrier member comprises an electrode arranged to be in electrical contact with the liquid adjacent a region of the meniscus; and a voltage controller configured to provide a controlled voltage difference between the electrode and the substrate, the substrate table, or both the substrate and the substrate table, when there is relative movement between the substrate table and the projection system in a direction that is substantially toward the region of the meniscus.

According to an embodiment of the present invention, there is provided a device manufacturing method, comprising:

supporting a substrate on a substrate table, wherein the substrate, the substrate table, or both the substrate and the substrate table, is coated with a layer of an electrically insulating material;

projecting a patterned beam of radiation onto the substrate using a projection system;

supplying liquid to a space between the projection system and the substrate or substrate table at least partly defined by a barrier member, wherein there is a space between the barrier member and the substrate, the substrate table, or both the substrate and the substrate table, in which a meniscus, that surrounds the space, forms between the liquid and surrounding gas and the barrier member comprises an electrode in electrical contact with the liquid adjacent a region of the meniscus; and providing a controlled voltage difference between the electrode and the substrate, the substrate table, or both the substrate and the substrate table, when there is relative movement between the substrate table and the projection system in a direction that is substantially towards the region of the meniscus.

According to an embodiment of the present invention, there is provided an immersion lithographic apparatus comprising: a surface that at least periodically is in contact with an immersion liquid; and an active immersion liquid control system, configured to control the contact angle of the immersion liquid on the surface.

According to an embodiment of the present invention, there is provided a method of controlling the behavior of a liquid on a surface within an immersion lithographic apparatus, comprising controlling the contact angle of the liquid on the surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
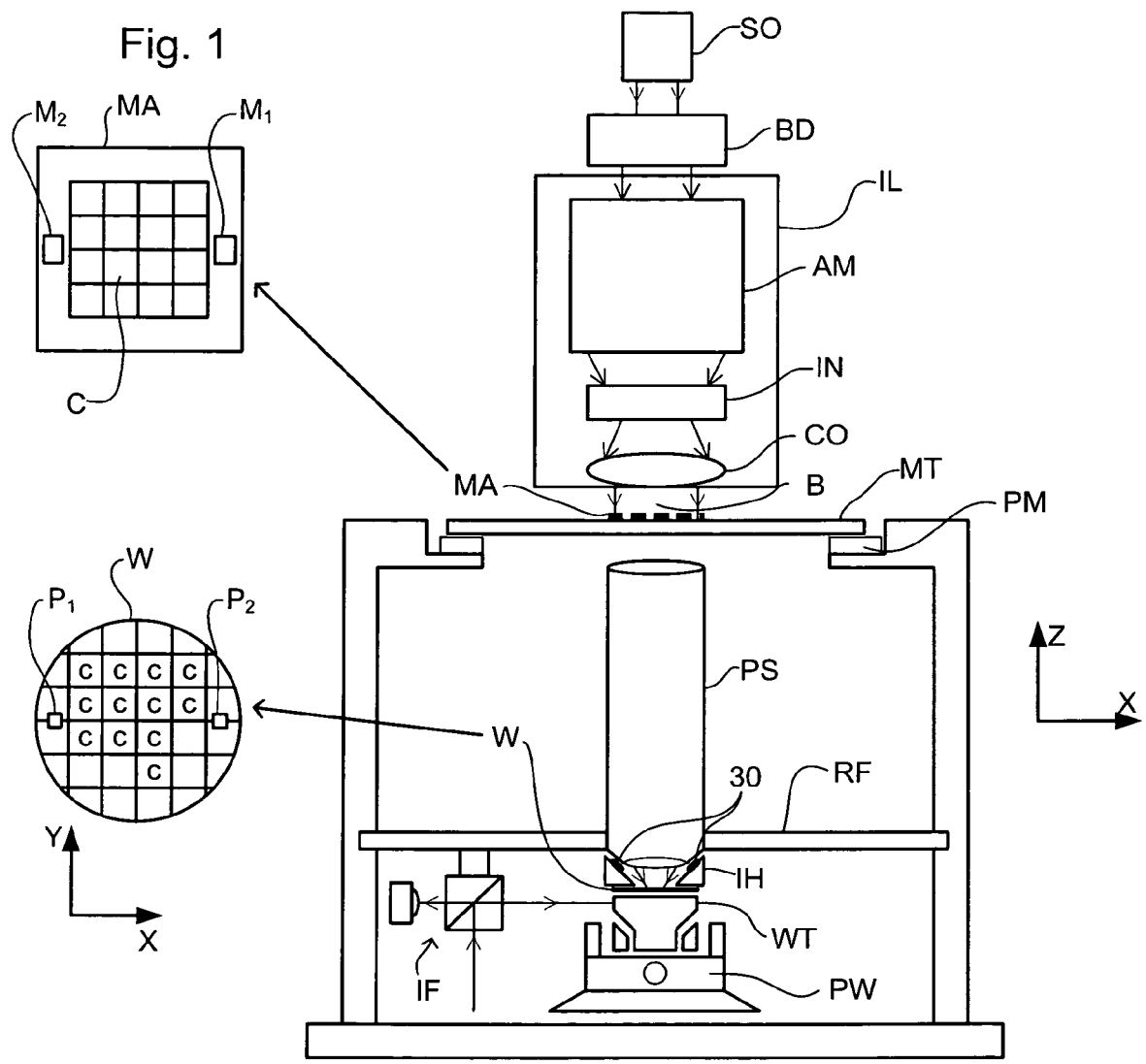
FIG. 1 depicts a lithographic apparatus according to an embodiment of the invention.
Figure 2:
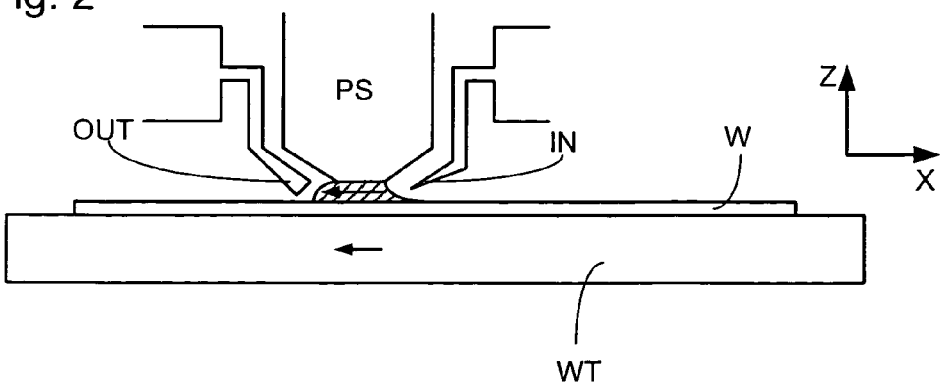
FIGS. 2 and 3 depict a liquid supply system used in a prior art lithographic projection apparatus.
Figure 3:
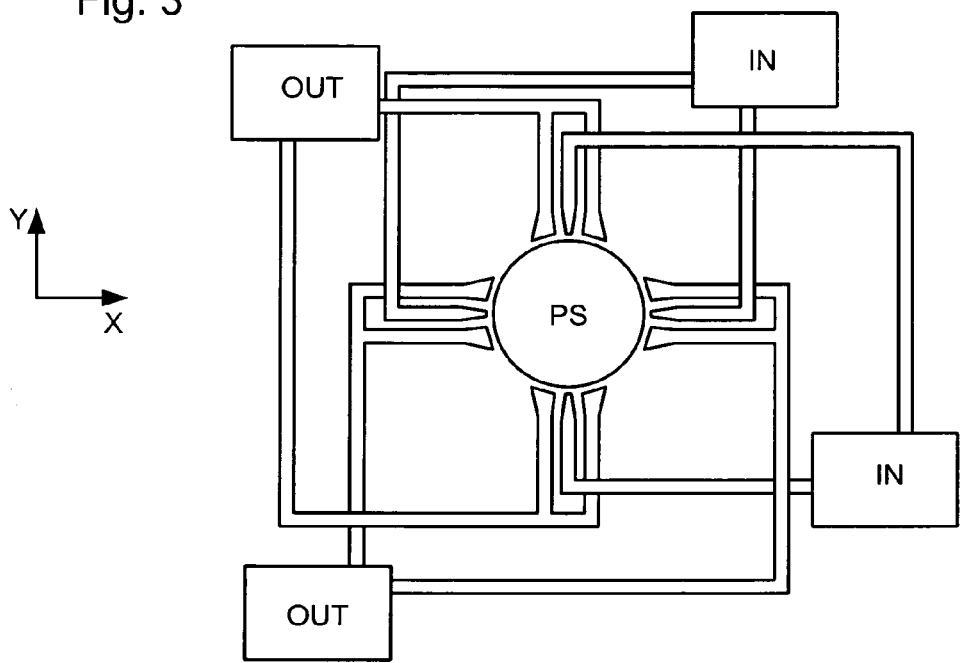
Figure 4:
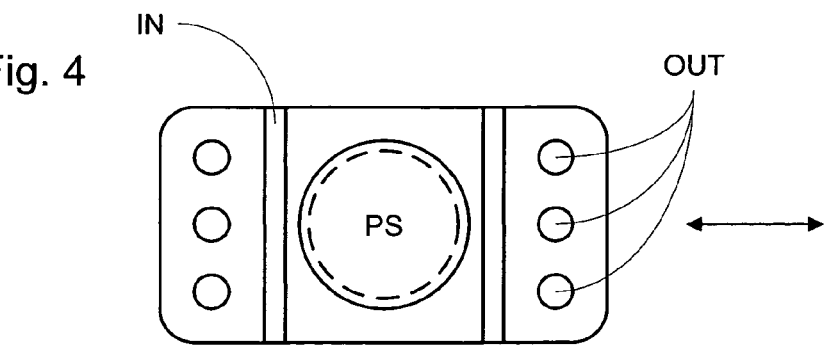
FIG. 4 depicts a further liquid supply system for use in a lithographic projection apparatus.
Figure 4:
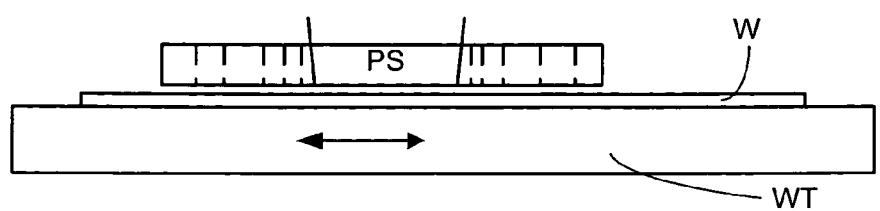

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an immersion lithographic apparatus, droplets of immersion liquid may be unintentionally transferred to, or left behind on, a surface or part of a surface where no immersion liquid is intended to be situated at a particular time. This may cause a problem which may result in a defective substrate being produced.

A problem may be that the presence of unwanted immersion liquid droplets may cause a defect itself. For example, if unwanted droplets are formed or left behind on a lens or sensor element, then this may alter the optical properties of that element and lead to inaccuracy in, for example, measurement and/or focusing.

Further, if the unwanted immersion liquid droplets are left on the surface, then they may evaporate. In turn, this evaporation may cause a thermal load to be applied to the element of the lithographic apparatus comprising the surface on which the unwanted droplets are situated. This thermal loading may result in further inaccuracy, for example by changing an optical property of the element and/or physically deforming the element in an uncontrolled manner.

A further problem caused by allowing the unwanted droplets to remain on the surface and evaporate is that contaminants may build-up on the surface once the liquid has evaporated. The contaminants may be a result of impurities that have built up in the immersion liquid or of additives in the immersion liquid.

A possible technique for removing the unwanted immersion liquid droplets is to passively remove them from the surface on which they are situated. This can be achieved by applying a liquid-phobic coating to that surface. Alternatively, it can be achieved by using a combination of liquid-phobic and liquid-philic coatings. However these techniques for passively removing the unwanted droplets may remove the droplets relatively slowly. Thus, one or more of the problems associated with their presence outlined above may occur.

A quicker way of removing the unwanted immersion liquid droplets is to use a gas stream to blow them away from the surface. However, using such a gas stream may result in partial evaporation of the droplets, which in turn may result in one or more of the associated problems discussed herein such as, for example, thermal loading and/or build up of impurities.

It is desirable to remove unwanted droplets of immersion liquid from a surface of an immersion lithographic apparatus, desirably its immersion system, quickly and without incurring significant evaporation of the immersion liquid droplets. As used herein, the "immersion system" can comprise at least a liquid handling system, the substrate table WT and a final element of the projection system PS. Although an embodiment of the invention is discussed below with reference to liquid, the same principles can be used for another fluid. For example, it will be understood that an embodiment of the present invention is applicable to at least fluid droplets, liquid droplets, fluid droplets with solid particles suspended therein, and liquid droplets with solid particles suspended therein.

The term droplet can be taken to mean, for example, a discrete droplet that does not form part of a body of liquid larger than itself. Furthermore, a droplet could not be connected, via liquid, to another body of liquid. It will also be understood that references in this application to control or removal of a plurality of droplets apply equally to the control or removal of a single droplet and vice versa.

It will also be understood that an embodiment of the invention may be applied to any component in a lithographic apparatus. In particular, it may be applied to any component in an immersion lithographic apparatus, including, for example, the immersion system. An embodiment of the invention is most likely to be applied to a surface susceptible of having unwanted immersion liquid droplets formed thereon. This may include, for example, a surface of and/or around: the final element of the projection system PS; the substrate W; the substrate table WT; a liquid handling system, such as a barrier member 120 of a liquid handling system; and/or an immersion system, namely a system for providing, confining or controlling immersion liquid in an immersion lithography apparatus.

An embodiment of the invention is particularly applicable to any form of immersion lithography apparatus which may comprise an immersion system having a localized liquid supply system (i.e. "local area") or having an unconfined liquid supply system such as a "bath", and "all-wet" arrangement. In a "bath" arrangement, the substrate is fully immersed (i.e. submerged) in a bath of the immersion liquid. In an "all-wet" arrangement, the major surface of the substrate facing the projection system is fully covered with immersion liquid. The immersion liquid may cover the substrate in a film, which is desirably thin. The immersion liquid may be supplied so that it is free to flow over the substrate and maybe over the substrate table surrounding the major surface of the substrate.

Figure 5:
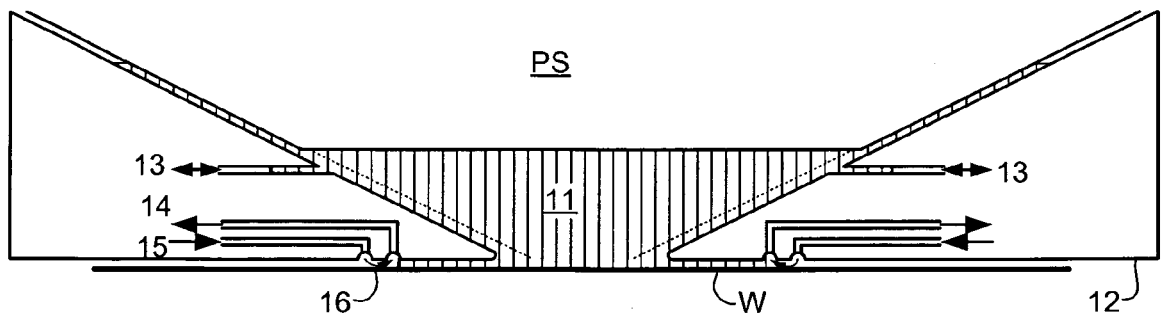
FIG. 5 depicts a further liquid supply system for use in a lithographic projection apparatus.

In another immersion lithography apparatus with a localized liquid supply system, the supply system has a barrier member (or so-called immersion hood) which extends along at least a part of a boundary of the space between the final element of the projection system and the substrate table. Such a solution is illustrated in FIG. 5. The barrier member is substantially stationary relative to the projection system in the XY plane. However, there may be some relative movement in the Z direction (in the direction of the optical axis). A seal is formed between the barrier member and the surface of the substrate.

Referring to FIG. 5, a seal member 16 forms a contactless seal to the substrate around the image field of the projection system so that liquid is confined to fill a reservoir or an immersion space 11 between the substrate surface and the final element of the projection system. The reservoir 11 is formed by a barrier member 12 positioned below and surrounding the final element of the projection system PL. Liquid is brought into the space below the projection system and within the barrier member 12. For example, the liquid may be provided and/or removed through port 13. The barrier member 12 extends a little above the final element of the projection system. The liquid rises above the final element so that a buffer of liquid is provided. The barrier member 12 has an inner periphery that at the upper end, in one arrangement, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the barrier member 12 and the surface of the substrate W. The gas seal is formed by gas, e.g. air or synthetic air. In one example, $N_2$ or another inert gas, is provided under pressure via inlet 15 to the gap between barrier member 12 and substrate W. The gas is extracted via first outlet 14. The overpressure on the gas inlet 15, vacuum level on the first outlet 14 and geometry of the gap are arranged so that there is a high-velocity gas flow radially inwards that confines the liquid. Such a system is disclosed in United States patent application publication no. US 2004-0207824.

Figure 6:
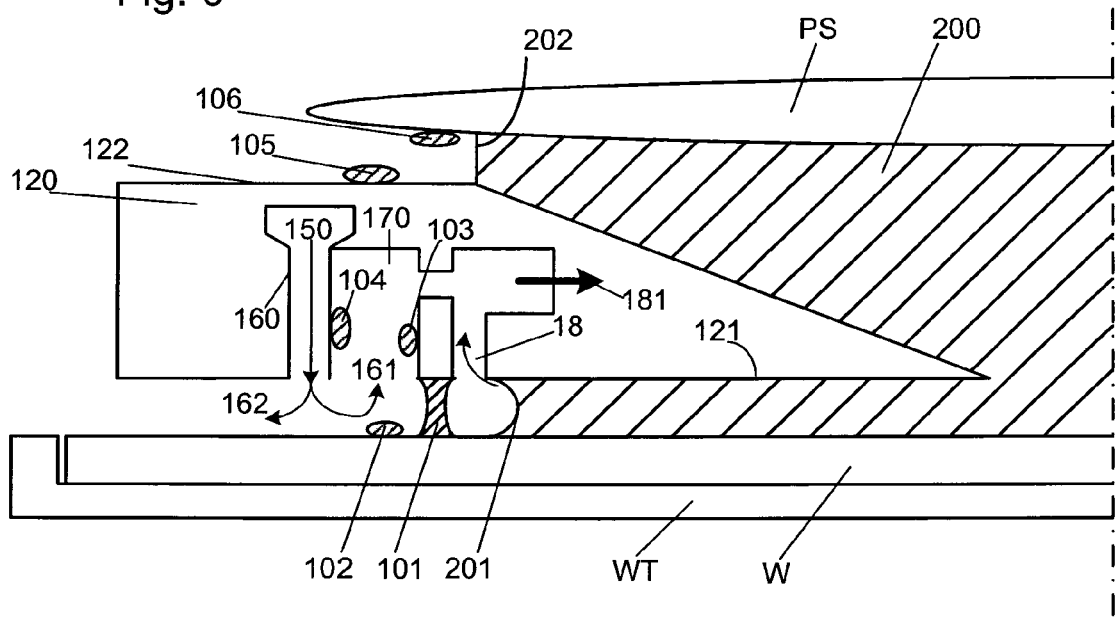
FIG. 6 depicts a close-up cross sectional view of an example barrier member and surrounding areas showing typical locations where unwanted droplets may form.

A further example of an immersion lithography apparatus is shown in FIG. 6. The apparatus of FIG. 6 has a liquid handling system for, for example, supplying, containing, and removing immersion liquid. The liquid handling system may comprise a barrier member 120. The liquid handling system can have one or more of: a liquid supply system (not shown in FIG. 6, but analogous to inlet 13 in FIG. 5); a liquid removal system 18, 181; and/or a seal member 160 to hinder movement of immersion liquid past it. The seal member 160 may serve to confine the immersion liquid to a volume. A typical localized area immersion lithographic apparatus, such as that shown in FIG. 6, may serve to contain a main body 200 of the immersion liquid.

One or more unwanted droplets of immersion liquid can be left or formed on any surface of an immersion lithography apparatus, such as its immersion system. FIG. 6 shows a close up view of a cross section through an immersion system and surrounding features of an immersion lithographic apparatus. FIG. 6 shows the position of various unwanted liquid droplets that may form on or be left on one or more surfaces of the illustrated portion of an immersion lithographic apparatus. For simplicity, only half of the cross section through the immersion system and surrounding features is shown. The location of the unwanted droplet(s) shown in FIG. 6 is typical of those that would be found in a conventional immersion lithographic apparatus, as described below. However, it will be understood that one or more unwanted immersion liquid droplets could be formed on any other surface of an immersion lithography apparatus.

The shaded areas indicate where the immersion liquid is situated. The only part of the apparatus shown in FIG. 6 where the presence of the immersion liquid is desirable is region 200. The region 200 is bounded by the final element of the projection system PS, the substrate W (or substrate table WT), and a surface of the barrier member 120. A primary meniscus 201 extends between a bottom surface 121 of the barrier member 120 and the substrate W. A liquid edge 202 extends between the barrier member 120 and the final element of the projection system PS. The liquid edge 202 may be formed by, for example, surface tension.

A typical area on which unwanted immersion liquid droplets may be formed is a surface 121 of the barrier member 120 facing the substrate W. As shown in FIG. 6, the barrier member 120 is provided with an immersion liquid extraction duct 18 formed in the surface 121 of the barrier member 120 facing the substrate W. The extraction duct 18 is part of the liquid handling system that controls the flow of immersion liquid through the immersion lithographic apparatus. The duct 18 is one of several needle-type extraction ducts located at different peripheral positions. The ducts 18 are positioned to surround the area 200. The ducts are arranged to remove the immersion liquid, ultimately through outlet 181 which is open to an underpressure. This system is effective in ensuring that most of the immersion liquid does not pass radially beyond the inlet of extraction duct 18. However some of the immersion liquid may not be extracted through extraction duct 18, and this liquid may then form unwanted droplets outside of the area 200 where the immersion liquid is desired. Such droplets on the barrier member 120 may subsequently fall onto the substrate resulting in defects on the substrate W. Such defects may be shown as arcs and lines in a pattern defect test.

Typically, an unwanted secondary body of immersion liquid 101 can form just beyond the entrance to the extraction duct 18. This secondary body of immersion liquid 101 forms between the surface 121 of the barrier member 120 facing the substrate W, and the substrate W and/or substrate table WT. When reference is made herein to the substrate W, or to the substrate table WT, this can mean substrate W and substrate table WT. As the substrate W and substrate table WT move relative to the barrier member 120 and projection system PS, the secondary body of immersion liquid 101 moves relative to the substrate W to form a droplet 102 on the surface of the substrate W and/or substrate table WT. This means that a trail of unwanted immersion liquid droplets 102 may be left on the substrate W and/or the substrate table WT. One or more unwanted droplets may also form on the surface 121 of the barrier member. These droplets 102, resulting from the secondary body of immersion liquid 101, may then cause defects on the substrate W and/or substrate table WT. Such defects may be shown as arcs and lines in a pattern defect test.

Liquid that has not been collected by extraction duct 18 could be transported further away from the main body of immersion liquid 200. In order to prevent or at least reduce this, an immersion lithographic device may have a gas seal 160. In the illustrated embodiment, the gas seal 160 is a gas-knife having an inlet 150 into the immersion system through which gas passes. A gas flow from the gas knife 160 is directed towards the substrate W. The gas knife 160 is arranged so as to hinder any immersion liquid passing beyond it. Ideally the gas knife 160 stops any immersion liquid passing beyond it. Ideally, the gas knife 160 stops any immersion liquid passing beyond it. Arrows 161 and 162 in FIG. 6 show the direction of gas flow paths. Ultimately, the gas flow that follows path 161 (i.e. in the direction towards the main body of immersion liquid 200) also exits through outlet 181. There is provided a recess 170 in the barrier member 120 radially inward (relative to the optical axis of the projection system) of the gas knife 160. This recess 170 is to provide a suitable gas flow exit path for the gas from the gas knife that flows along a flow path 161 radially inward from the gas knife 160.

Unwanted droplets of immersion liquid may form on either side of the gas knife 160. For example, they could be formed on a surface radially inward (relative to the optical axis of the projection system). They could be formed radially outward of the gas knife 160. Unwanted droplets of immersion liquid may form on a surface radially outward of the gas knife 160 because of, for example, gas from the gas knife causing droplets on the substrate or substrate edge to splash upwards onto a surface of the immersion system, such as the lower surface 121 of barrier member 120 that faces the substrate W. In the example shown in FIG. 6, no unwanted immersion liquid droplets are shown on a surface radially outward of the gas knife 160.

In the illustrated example, unwanted immersion liquid droplets have been formed on a surface radially inward of the gas knife 160 (i.e. in the direction towards the main body of immersion liquid 200). Two droplets are shown in the example of FIG. 6. One droplet 103 is on a radially inward surface of the recess 170 forming gas outlet path 161. One droplet 104 is on a radially outward surface of the recess 170 forming gas outlet path 161. Droplets 103 and 104 could be susceptible to falling or draining onto the substrate surface W, for example due to the force resulting from gravity, potentially causing a problem such as discussed above. Any surfaces which experience recirculating gas flow from the operation of the gas knife 160 will be particularly susceptible to having immersion liquid droplets formed thereon.

In addition to those droplets 102, 103 shown in FIG. 6 as having been formed on the surface of the barrier member 120 which faces the substrate W, unwanted immersion liquid droplets may form at any other location. The precise location of the unwanted immersion liquid droplets may depend on, for example, the particular design of the liquid handling system. The precise location of the unwanted immersion liquid droplets may depend on, for example, the particular relative movement of the barrier member 120, projection system PS, substrate W, and substrate table WT.

Unwanted droplets may form on a surface that has a welded joint. It may be particularly difficult to remove all of the immersion liquid from the surface of such a joint.

A further region where unwanted immersion liquid droplets may be formed is on the opposing surfaces of the final element of the projection system PS and the barrier member 120, for example on a surface 122 of the barrier member 120 that faces away from the substrate W. The surface 122 may be located between the substrate W and the final element of the projection system PS, and may be referred to as the upper surface 122 of the barrier member 120. This surface is particularly susceptible to having unwanted immersion liquid droplets formed. The lower surface of the final element of the projection system PS is also particularly susceptible to having unwanted immersion liquid droplets formed thereon.

A reason for this is that, during stepping and/or scanning operations, the substrate table WT and substrate W move relative to the projection system PS, the barrier member 120 and other parts of the liquid handling system. The momentum of the immersion liquid in body 200 causes the liquid to move, so that its upper meniscus, i.e. liquid edge 202, moves between the surface of the final element of the projection system and the upper surface of the barrier member 120. The part of the liquid edge at the front of the barrier member in the direction of the scan direction moves towards the optical axis of the projection system; the part of the liquid edge at the rear of the barrier member in the scan direction moves away from the optical axis. When the scan direction reverses in a next scan step, the direction of movement of each portion of the liquid edge changes. So through successive scanning motions, the position of the liquid edge oscillates. As the scan motion is fast, oscillation may be fast and uncontrolled. Thus droplets may be formed by the movement of the liquid edge. This phenomenon is referred to as "sloshing". This relative motion can result in droplets of the immersion liquid being deposited on, for example, the final element of the projection system PS and/or the upper surface 122 of the barrier member 120. The final element of the projection system PS, as referred to herein, could be, for example, a projection lens, such as a so-called WELLE lens. In normal use, the level of the immersion liquid between the barrier member 120 and the final element of the projection system PS may vary and that, whenever the immersion liquid recedes from a surface, unwanted droplets may remain.

Alternatively or additionally, an unwanted droplet can form on the surface 122 of the barrier member 120 (namely the surface that faces away from the substrate W and/or the substrate table WT) and the lower surface of the final element of the projection system PS (namely the surface that faces the substrate W and/or the substrate table WT) as a result of the substrate table WT and/or substrate W relatively moving towards the barrier member 120. This could happen if, for example, an error in control of the substrate W or substrate table WT were to occur. If this happened, the main body of immersion liquid 200 could overflow into the region between the surface 122 of the barrier member 120 facing away from the substrate W, and the lower surface of the final element of the projection system PS. When this overflow of immersion liquid retreats (e.g., when the substrate W and substrate table WT move back away from the barrier member 120), unwanted droplets of immersion liquid could be left on the surface 122 of the barrier member 120 and the lower surface of the final element of projection system PS.

In the example shown in FIG. 6, one unwanted droplet 105 is shown on the upper surface 122 of the barrier member 120. A further unwanted droplet 106 is shown on the lower surface of the projection system PS.

As explained previously, if any unwanted droplet is left on one of the surfaces, then it may evaporate, thereby possibly applying an unwanted heat load to the particular surface. In the case of the droplet 106 on the lower surface of the final element of projection system PS, this could be particularly problematic because an unwanted heat load would be applied to the final element of projection system PS by evaporation of the droplet. This could affect an optical property, and performance, of the projection system PS. This could be particularly problematic if, for example, the final element of the projection system PS were a lens element. During evaporation, the heat load could vary with time leading to an unpredictable variation in an optical property of the projection system PS. Compensating for such an unpredictable variation in optical property may be extremely difficult to achieve.

The droplet 105 on the upper surface 122 of the barrier member 120 may, if left, evaporate causing an unwanted heat load to the barrier member 120. This unwanted heat load may cause deformation of the barrier member 120. This may lead to difficulty in, for example, positioning the barrier member 120. It may lead to an optical property of the main body of immersion liquid 200 being altered.

Further, evaporation of any droplet in the immersion system may cause the various surfaces which bound the main body 200 of immersion liquid to cool down. For example, the lower surface of the final element of the projection system PS, a surface of the barrier member 120, and/or the substrate surface itself could cool down. In turn, this may lead the main body of immersion liquid 200 to cool down itself, thereby affecting an optical property of the main body 200 of immersion liquid such as by altering the refractive index of the liquid.

Figure 7:
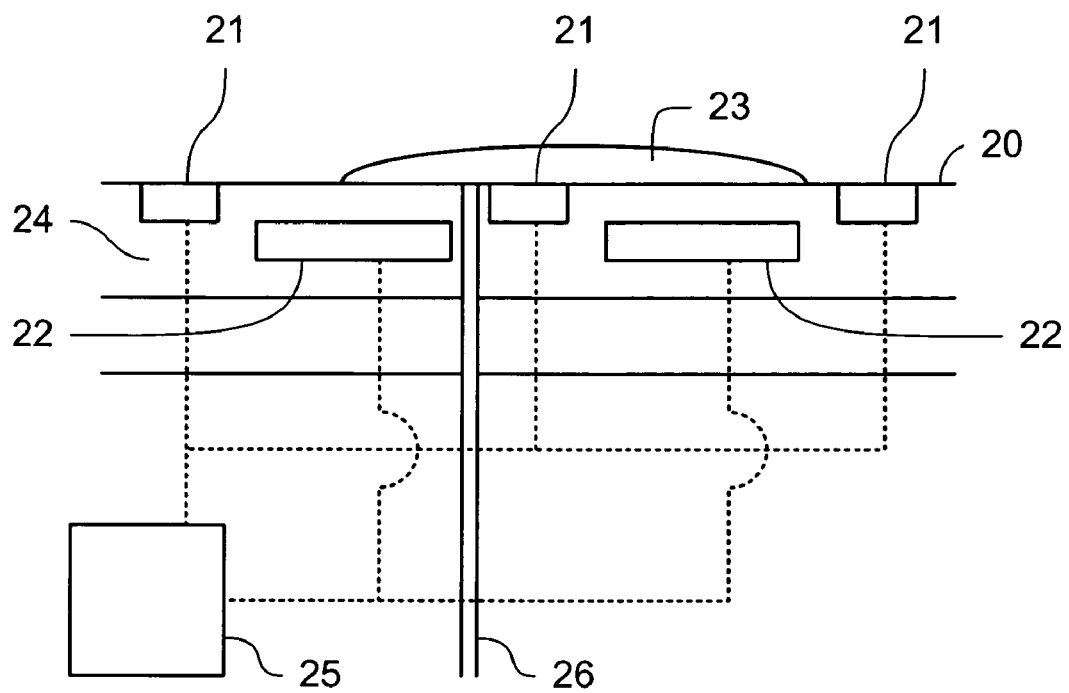
FIG. 7 depicts a schematic view of a surface of an immersion lithographic apparatus incorporating an embodiment of the present invention.

FIG. 7 depicts an embodiment of the present invention that assists in the removal of droplets of immersion liquid from a surface of the immersion lithographic apparatus. As shown, the surface 20 is provided with a plurality of electrodes 21,22. Electrodes 21 of a first type are formed on or exposed to the surface 20 such that a droplet 23 of immersion liquid on the surface may be directly in contact with an electrode 21 of the first type. Accordingly, the electrode 21 of the first type may be electrically connected to the immersion liquid of the droplet 23. As depicted in FIG. 7, electrodes 22 of a second type may be formed within an electrically insulating layer 24 on the surface 20. Alternatively or additionally, the electrodes 22 of the second type may be formed on the surface 20 and coated with an insulating layer. In any case, the electrodes 22 of the second type are electrically isolated from both the electrodes 21 of the first type and from any droplets 23 of immersion liquid formed on the surface 20.

A voltage controller 25 is provided and is arranged such that it can provide a controlled voltage difference between the electrodes 21 of the first type and the electrodes 22 of the second type. When such a voltage difference is provided, a voltage difference may therefore be established between a droplet 23 of immersion liquid in contact with the electrode 21 of the first type and an electrode 22 of the second type that is adjacent the droplet 23 of immersion liquid but electrically isolated from it. As a result, the droplet 23 of immersion liquid undergoes an electro wetting effect. Accordingly, the contact angle of the droplets 23 of immersion liquid relative to the surface 20 is reduced and the droplet 23 becomes more spread out on the surface.

A benefit of the use of such a system on a surface within an immersion lithographic apparatus is that the droplets that are subject to the electro wetting effect, and therefore are spread out on the surface, are less likely to fall from the surface. Accordingly, this system may be applied to a surface on which droplets of immersion liquid form and can subsequently fall from the surface, for example onto the substrate. By spreading the droplet 23 of immersion liquid on the surface 20, this may increase the likelihood of the droplet 23 coming into contact with an opening to a conduit 26 that may be used to extract immersion liquid from the surface 20. For example, the conduit 26 may be sufficiently small that immersion liquid is extracted from the surface 20 by capillary action. In addition, as disclosed in Unites States patent application publication no. US 2007-0146666, the conduit 26 may use a combination of capillary action and electrostatic force to urge immersion liquid to flow in a given direction. However, any form of immersion liquid extraction may be used in combination with an embodiment of present invention. As explained above, the use of the electro wetting effect to reduce the likelihood of droplets falling from the surface 20 may provide sufficient benefit that an embodiment of the present invention may be used without an immersion liquid extraction system such as conduit 26 or without the operation of such a system.

The arrangement of electrodes 21,22 on the surface 20 may be such that a plurality of discrete droplets 23 of immersion liquid on the surface 20 are spread out sufficiently under the influence of the electro wetting effect that a continuous film of immersion liquid is formed on the surface 20. Beneficially, this may facilitate the removal of the immersion liquid via conduit 26, for example, and/or may further reduce the likelihood of immersion liquid falling from the surface 20.

Any number of electrodes 21 of the first type and any number of electrodes 22 of the second type may be used, depending on the size of the surface 20. Likewise, any appropriate configuration or arrangement of the electrodes on or adjacent to the surface 20 may be used. In an advantageous arrangement, the separation of adjacent electrodes 21 of the first type may be selected such that the separation corresponds to the maximum size of the droplet of immersion liquid that is considered to be non-problematic on the particular surface of the immersion lithographic apparatus. Accordingly, once a droplet becomes sufficiently large to be problematic, for example because it is sufficiently large that it may fall from the surface or may cause significant cooling through its evaporation, it will come into electrical contact with at least one electrode 21 of the first type, thereby enabling the electro wetting effect.

An embodiment of the present invention may be applied at any location where unwanted immersion liquid droplets may be formed, located, or left. For example, the embodiment discussed above may be applied to all of the surfaces discussed above on which droplets of immersion liquid may form. For example, it may be applied to a surface radially inward of the gas seal 160, a radially inside or outside surface of the recess 170 forming gas outlet path 161 or the bottom surface 121 of the barrier member 120. In addition, the embodiment as described above may be applied to a surface located on the top surface of the substrate table WT. This may be because, for example, immersion liquid droplets may be left on the top surface of the substrate table, or on a seal that may be located between the substrate and the substrate table, from when it is immersed in immersion liquid during exposure of dies located towards the edge of the substrate W.

The above described embodiment can be provided to a surface on which unwanted immersion liquid droplets may form in an "all-wet" immersion lithographic apparatus. An "all-wet" immersion lithographic apparatus comprises an immersion lithography system in which the immersion liquid is unconfined by the liquid supply system of its immersion system. Thus, at least the whole of the major surface of the substrate W undergoing exposure is immersed in an immersion liquid during exposure. Thus, even areas of the substrate that are not being exposed at a given time are still covered by immersion liquid. This is in contrast to the arrangement described above in which only an area surrounding the target portion of a substrate W (i.e., that portion of the substrate W currently being exposed) is covered by an immersion liquid during exposure.

The examples of where unwanted immersion liquid droplets may be formed described herein in relation to other embodiments are still applicable to an "all-wet" immersion lithographic apparatus. In addition, an "all-wet" immersion lithographic apparatus may use the herein described embodiments for other surfaces on which unwanted immersion liquid droplets may form.

For example, unwanted droplets may form on the a gridplate, skirt and encoder head (all of which may affect the positioning system), and/or on the substrate table WT. In particular, with reference to the substrate table WT, in an "all-wet" immersion system, the gap between the substrate edge and the substrate table WT is filled with immersion liquid during operation. However, it is common, and undesirable, for droplets of the immersion liquid to remain in this gap, and/or on the substrate edge, even after drying. Any droplets remaining on the substrate table WT may prevent a subsequent substrate W being located properly on the substrate table WT. This may increase the chance of incorrect positioning of the substrate W. Furthermore, when the subsequent substrate W is located on the substrate table WT, any unwanted immersion liquid droplets remaining on the substrate table WT could splash onto other areas, including onto the substrate W itself. As these unwanted immersion liquid droplets evaporate, they may lead to one or more of the problems outlined above. For example, the evaporation of droplets may leave drying stains, leave contaminating particles and/or cause unwanted heat load in the elements comprising the surface on which they are located.

Therefore, the above described embodiment can be provided to a surface of an "all-wet" immersion system in order to control such unwanted immersion liquid droplets and/or assist in their removal. For example, electrodes can be provided in the manner described above on the base of the substrate table WT, i.e. on the surface of the substrate table W that faces the substrate W. Electrodes can be provided in the gap between the substrate table WT and the peripheral edge surface of the substrate W itself. Further, electrodes may be provided on a surface such as the edge of the substrate table.

The embodiment described above with respect to FIG. 7 relates to the use of electro wetting for control of droplets formed on a surface of an immersion lithographic apparatus having one or more needle-type immersion liquid outlets 18. However an embodiment of the invention could be used with any type of immersion lithographic apparatus. In particular, electro wetting arrangements may be beneficially applied to an immersion lithographic apparatus having a single-phase extraction system. This could be, for example, a micro-sieve immersion liquid extraction system as shown in FIG. 8.

Figure 8:
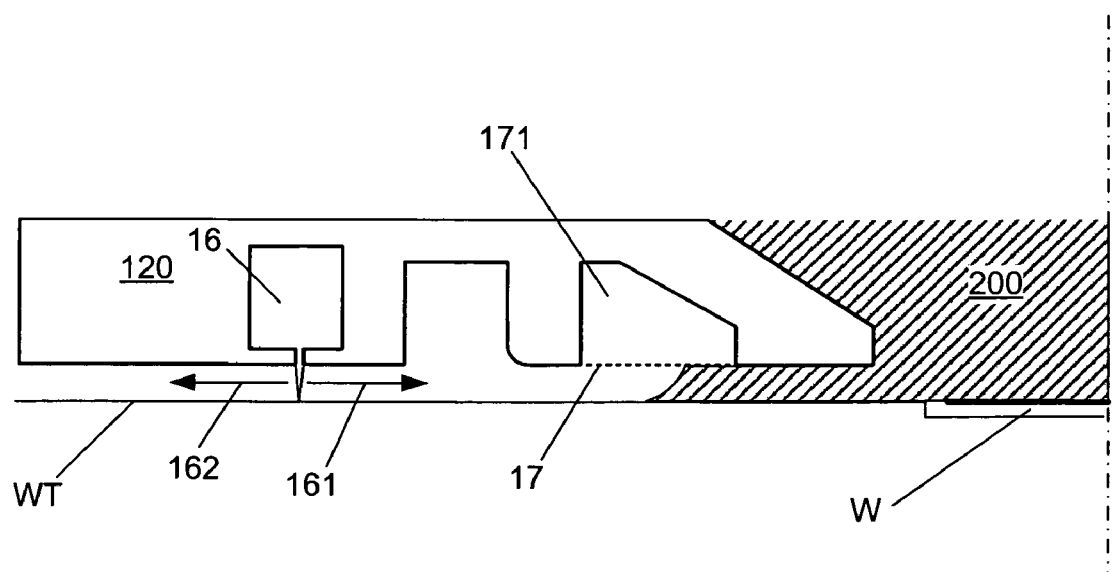
FIG. 8 depicts the application of an embodiment of the present invention to an immersion lithographic apparatus.

In the arrangement depicted in FIG. 8, the liquid extraction system comprises a chamber 171 which is maintained at a slight underpressure and is filled with the immersion liquid. The lower surface of the chamber is formed of a porous member 17 (also known as a micro-sieve) having a plurality of small holes, e.g. of diameter in the range of 5 to 50 μm. The lower surface of the chamber is maintained at a height less than 1 mm above a surface from which liquid is to be removed, e.g. the surface of a substrate W. For example it may be in the range of 50 to 300 μm. The porous member 17 may be a perforated plate or any other suitable structure that is configured to allow the liquid to pass therethrough. In an embodiment, porous member 17 is at least slightly liquidphilic, i.e. having a contact angle of less than 90° to the immersion liquid. Desirably, the contact angle is less than 60° and, more desirably, less than 30°.

The underpressure is such that menisci formed in the holes in the porous member 17 prevent gas being drawn into the chamber 171 of the immersion liquid extraction system. However, when the porous member 17 comes into contact with liquid on the surface W or substrate table WT there is no meniscus to restrict flow. Thus, the liquid can flow freely into the chamber 171 of the immersion liquid extraction system. Such a device can remove most of the liquid from the surface of a substrate W without drawing gas into the chamber 171. Further details on the use of such porous members may be found, for example, in European patent application publication no. EP 1 628 163.

In the example of FIG. 8, the immersion fluid extraction system is formed by a chamber 171 near the innermost edge of the underside of the barrier member 120. The chamber 171 may form a continuous band surrounding the region containing the body of immersion liquid. In particular it may be annular or ring-shaped. It may also be formed from a discontinuous series of separate chambers. The lower surface of the chamber 171 is formed by a porous member 17, such as a micro-sieve, as described above. Ring-shaped chamber 171 is connected to a suitable pump or pumps to remove liquid from the chamber and maintain the desired underpressure. In use, the chamber 171 is full of liquid but is shown empty in FIG. 8 for clarity.

The above described embodiment using controlled electro wetting on a surface to control droplets of immersion liquid on the surface may be applied to any surface of an immersion lithographic apparatus, in particular any surface of the immersion system or barrier member 120, using the liquid extraction system depicted in FIG. 8. In addition, in an embodiment of the present invention, electro wetting may be used to improve the performance of the liquid extraction system. In particular, during use, a porous member such as discussed above may become less effective after a given period of use. In particular, organic debris such as particles of the resist from the substrate and flakes of a top coat from the substrate may reduce the effectiveness of the porous member. For example, the debris may be deposited on the chamber 171 side of the porous member 17, preventing the liquid in the chamber 171 from being properly in contact with the surface of the porous member 17. Consequently, the meniscus that is intended to form in the holes of the porous member 17 to prevent gas being drawn into the chamber 171 may not form correctly and gas may be drawn into the chamber 171. In order to reduce this effect, an embodiment of the present invention may be used.

Figure 9:
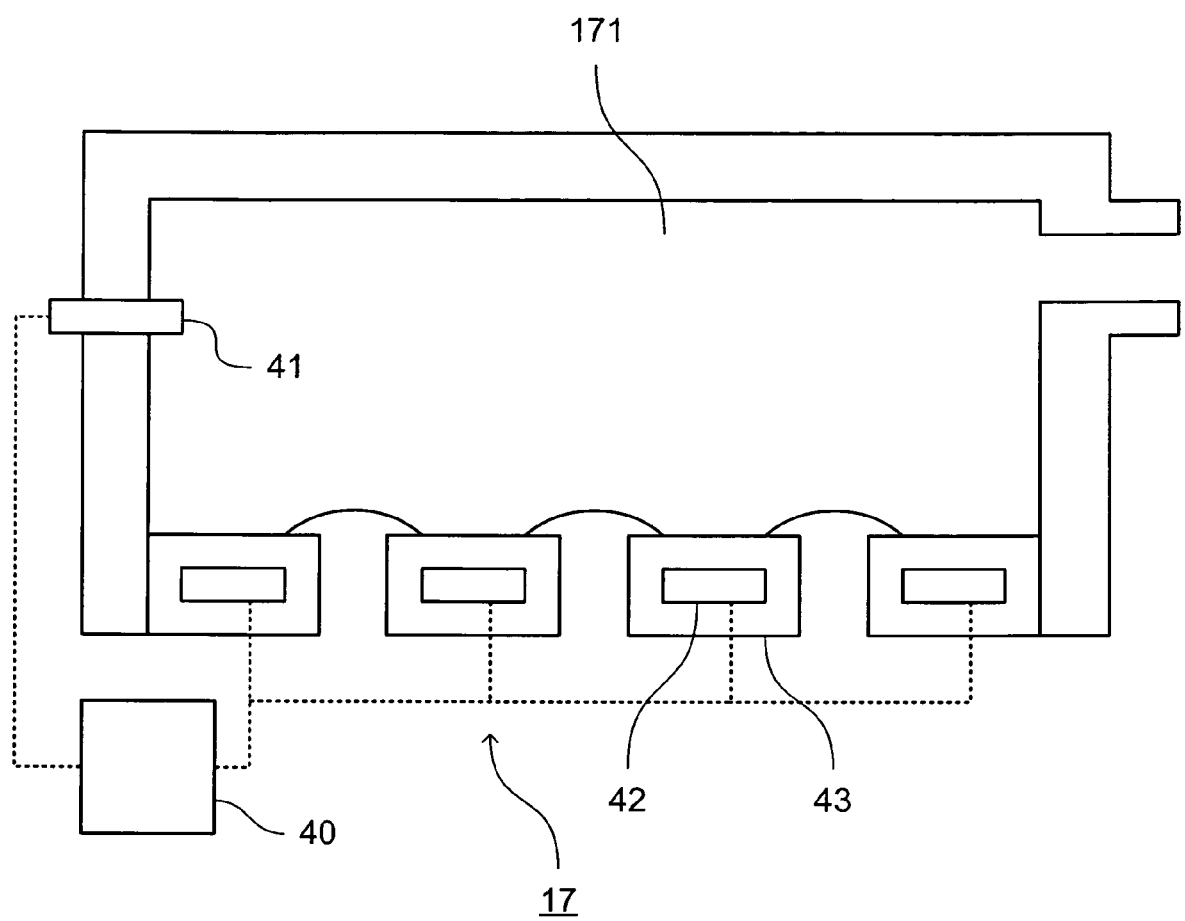
FIG. 9 depicts a detail of the application of the embodiment of FIG. 8 to an immersion lithographic apparatus.

FIG. 9 depicts an arrangement of a porous member 17 according to an embodiment of the present invention. In particular, a voltage controller 40 is provided that is configured to provide a controlled voltage between first and second electrodes 41, 42 in order to establish an electro wetting effect. The first electrode 41 is arranged such that it is in electrical contact with the immersion liquid within the chamber 171. It will be appreciated that a plurality of such electrodes may be provided if desired. The second electrode 42 is provided by the porous member itself or a part thereof. In particular, in the example depicted in FIG. 9, the porous member comprises an electrically conducting core 42 that functions as the second electrode formed, for example, from stainless steel and an insulating coating 43 formed around the electrically conducting core 42.

Accordingly, when the controlled voltage is applied between the first and second electrodes 41, 42 by the voltage controller 40, the immersion liquid electro wets on the surface of the porous member 17. The effect of this is to make the porous member more liquidphilic, desirably hydrophilic, helping to ensure that the immersion liquid within the chamber 171 remains in closer proximity to the porous member 17. Thus, the menisci within the holes of the porous member 17 may be better formed, and thus reduce the occurrence of gas being drawn into the chamber 171. Accordingly, a greater amount of debris may form on the surface of the porous member 17 before it ceases to function as desired than if this embodiment is not used. Therefore, the provision of this embodiment may extend the usable lifetime of the porous member 17.

The surface of the porous member may be selected to be liquidphilic, for example, by use of an appropriate coating.

In place of using the porous member 17 itself as the second electrode 42, distinct electrodes, isolated from the immersion liquid by a layer of insulating material, may be formed on the surface of the porous member 17.

The above described embodiments relate to the use of electro wetting to control droplets of liquid formed on a surface within an immersion lithographic apparatus, for example to reduce the likelihood of the droplets falling from a surface, to facilitate the extraction of the droplets of immersion liquid from the surface and/or to improve the wetting of the immersion liquid on a porous member in order to increase its useable lifetime. A further embodiment of the present invention uses electro wetting to reduce the likelihood of droplets of immersion liquid forming in the first place, in particular on the substrate itself or on the substrate table.

Figure 10:
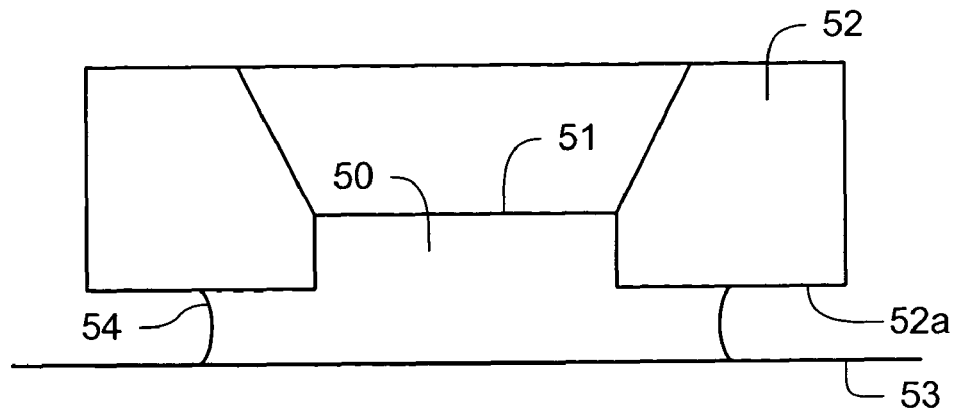
FIGS. 10 and 11 depict a problem encountered in an immersion lithographic apparatus.

An immersion lithographic apparatus comprising a localized immersion system, is schematically shown in FIG. 10. It is a generalization of the immersion systems shown in FIGS. 5 to 6 and 8. As shown, immersion liquid is confined in a space 50 defined by a surface 51 of the projection system, the barrier member 52 and a lower surface 53 that may be the substrate, a surface of the substrate table or a combination of both. In addition, a meniscus 54 that surrounds the space 50 forms in a gap between the lower surface 53 and a surface 52a of the barrier member 52 that is opposite the lower surface 53. The meniscus 54 forms between the immersion liquid and the gas surrounding it.

Figure 11:
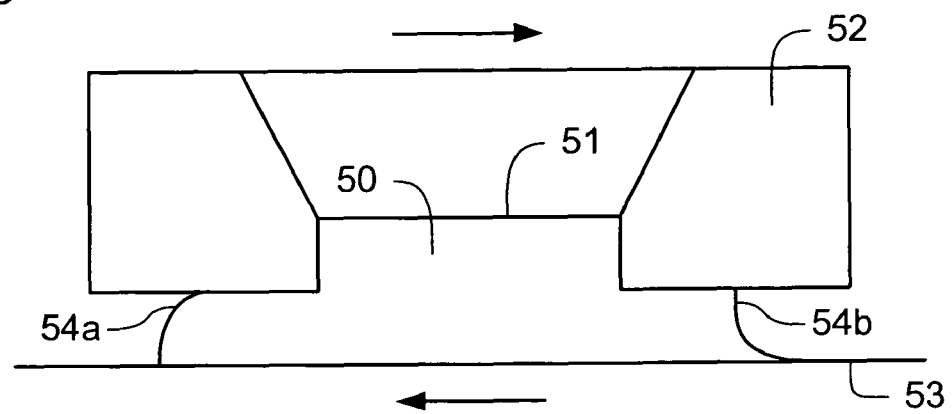

As schematically depicted in FIG. 11, during the exposure process, the substrate is moved relative to the projection system and the barrier member 52. Consequently, as shown, the contact angle of the meniscus at the lower surface 53 changes from the static contact angle shown in FIG. 10. In particular, at the advancing side 54a of the meniscus 54 the contact angle of the meniscus relative to the lower surface 53 increases and at the receding side 54b of the meniscus 54 relative to the lower surface 53, the contact angle decreases. If the contact angle at the receding side 54b of the meniscus decreases too far, immersion liquid may be lost, resulting in unwanted immersion liquid droplets being left on the lower surface 53 namely on the substrate or substrate table. Typically it is desirable that the contact angle at the receding side 54b does not drop below a given angle for the liquid. For example, when using water as the immersion liquid, it is desirably controlled to not drop below 20°, below 30°, below 40°, or below 50° in order to adequately reduce the likelihood of this occurring. Therefore, a coating may be applied to the surface of the bottom surface 53 that raises the static contact angle of the immersion liquid on the surface, enabling higher velocity of the substrate and substrate table relative to the projection system and barrier member 52 without the contact angle at the receding side 54b becoming too low. However, a benefit of increasing the static contact angle of the immersion liquid on the lower surface 53 is limited because if the contact angle on the advancing side 54a of the meniscus becomes too large, the meniscus may overrun, causing bubble entrapment within the immersion liquid. Accordingly, it would be typically desirably to ensure that the contact angle of the meniscus on the advancing side 54a relative to the lower surface 53 does not exceed a given angle for the liquid being used. For example, when using water as an immersion liquid, the contact is desirably controlled to not exceed 90°, exceed 80°, or exceed 70°. Accordingly, the usable static contact angle of the immersion liquid on the lower surface 53, and hence the maximum scanning velocity of the substrate and substrate table relative to the projection system and barrier member 52, may be limited.

Figure 12:
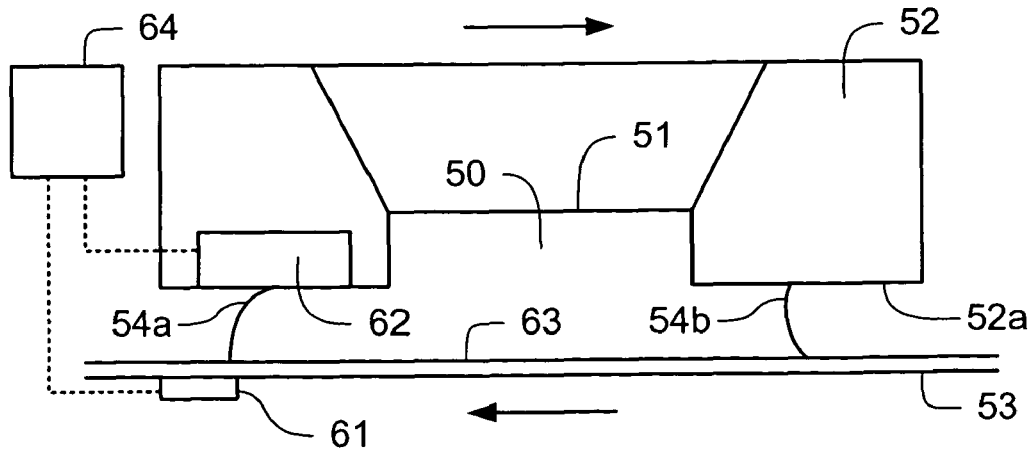
FIG. 12 depicts a solution to the problem explained in conjunction with FIGS. 10 and 11 according to an embodiment of the present invention.

An embodiment of the present invention, as depicted in FIG. 12, provides a system that may enable a faster scanning speed to be used and/or may reduce the loss of immersion liquid at the receding side and/or may reduce the likelihood of an overrun of the meniscus causing bubble entrapment at the advancing side.

As shown in FIG. 12, a first electrode 61 is provided in electrical contact with the lower surface 53, namely the substrate and/or substrate table. A second electrode 62 is provided to the lower surface 52a of the barrier member 52 in the region of the portion 54a of the meniscus on the advancing side. As shown, the lower surface 53 is electrically isolated from the immersion liquid by means of an insulating coating 63. A voltage controller 64 is provided that provides a controlled voltage between the first and second electrodes 61,62, thereby inducing an electro wetting effect within the portion 54a of the meniscus on the advancing side. Consequently, at the advancing side 54a, the contact angle of the immersion liquid on the lower surface 53 can be reduced by the application of a voltage difference between the first electrode 61 and the second electrode 62, and hence the immersion liquid. Therefore, because the contact angle can be reduced in this manner, a combination of a higher static contact angle and a higher velocity may be used without risking the resultant contact angle at the advancing side 54a becoming unacceptably high, for example causing an overrun of the meniscus with the ensuing risk of bubble entrapment within the immersion liquid. Consequently, by permitting a higher static contact angle, it is possible to help ensure that the resulting contact angle at the receding side 54b remains sufficiently high, reducing the likelihood of loss of immersion liquid at the receding side.

Figure 13:
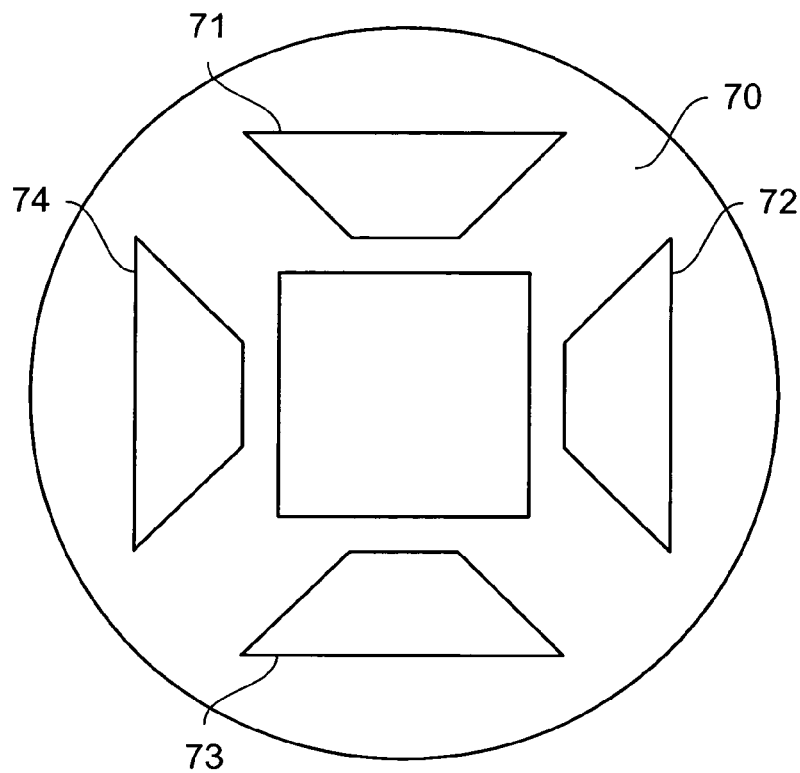
FIGS. 13 and 14 depict alternative arrangements of an immersion hood in an immersion lithographic apparatus according to the embodiment of FIG. 12.

The substrate and substrate table may be moved relative to the projection system and barrier member in a plurality of different directions. For example, the apparatus may be configured such that the substrate can be moved relative to the projection system in any direction parallel to the plane of the major surface of the substrate. Accordingly, as depicted in FIG. 13, which depicts in plan view the underside of a barrier member 70 that may be used in any of the apparatus depicted in FIGS. 5 to 6, 8 and 10 to 12, a barrier member may include a plurality of electrodes 71,72,73,74. In such a system, the voltage controller may be configured to control independently a voltage difference between each of the electrodes 71,72,73,74 on the barrier member 70 and the electrode that is electrically connected to the lower surface. Accordingly, when the substrate is moved in a particular direction relative to the barrier member 70 and the projection system, the voltage controller may provide a voltage difference between the lower surface 53 and an electrode that is associated with the advancing side of the meniscus and hence that portion of the immersion liquid. At the same time, it provides no or lower voltage difference between the lower surface 53 and other electrodes, and hence the corresponding adjacent portions of the immersion liquid.

The apparatus may be configured to control the contact angle only for a specific important direction of movement of the substrate and substrate table relative to the projection system and barrier member, such as the scanning direction and/or the stepping direction.

In a convenient arrangement, the lower surface, namely the substrate and/or substrate table may be connected to ground and the voltage controller may be configured such that it connects to ground any electrodes for which no voltage difference relative to the lower surface is required.

The electrodes 71,72,73,74 may be of any appropriate shape. In addition, it will be appreciated that any number of electrodes may be provided on the surface of the barrier member 70. In particular, 4, 6 or 8 electrodes may conveniently be provided. The voltage controller may establish a voltage difference between the lower surface and more than one of the electrodes if more than one of the electrodes are adjacent to the meniscus on the advancing side. For example, it may do so if a relatively large number of electrodes are provided to the barrier member. In addition, the electrodes should be electrically isolated from each other. For example, the surface of the barrier member may be coated with an insulating material and the electrodes may be formed on the surface of the insulating material.

Figure 14:
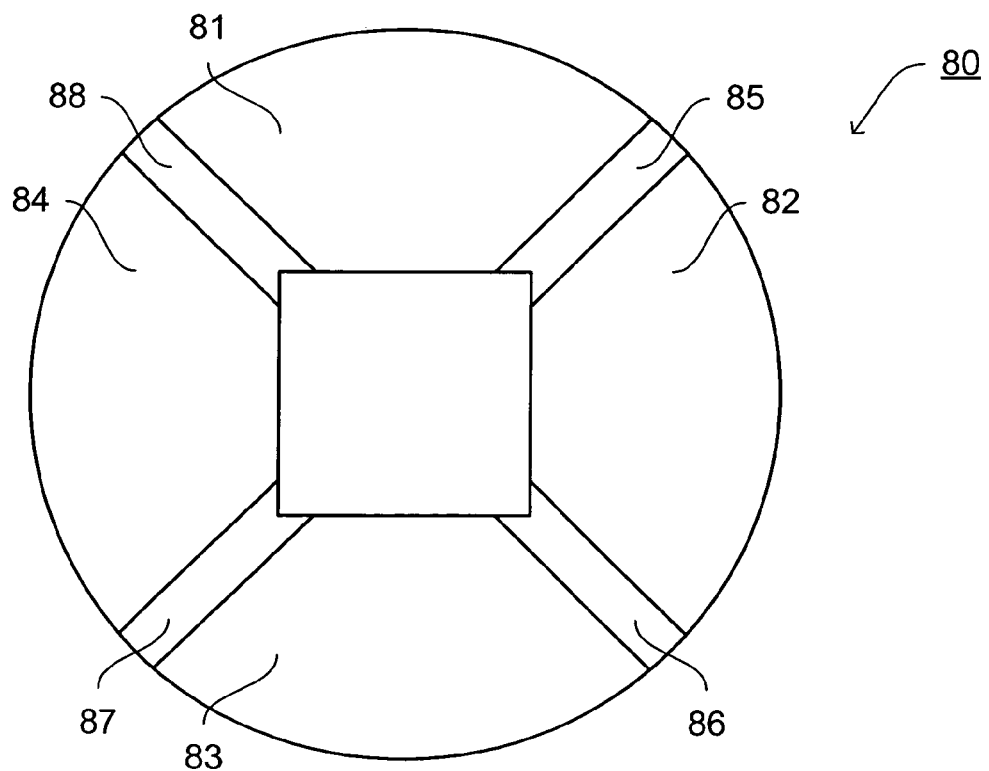

A different configuration of barrier member 80 is depicted in plan view in FIG. 14. As shown, in place of discrete electrodes formed on the surface of the barrier member, the barrier member 80 may be formed from separate sections 81,82, 83,84 that each function as an electrode and are electrically isolated from each other by sections 85,86,87,88 of electrically non-conducting material.

Figure 15:
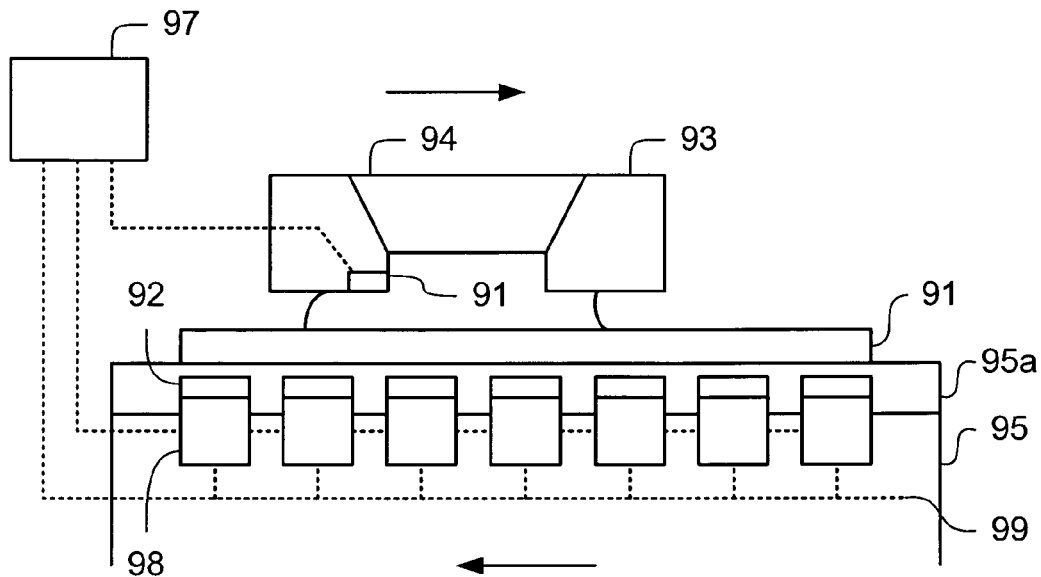
FIGS. 15 and 16 depict an application of an embodiment of the present invention to an immersion lithographic apparatus.

FIG. 15 depicts a further embodiment of the present invention that may, for example, be used to reduce the likelihood of the formation of liquid droplets. In particular, as with the embodiment described above with reference to FIGS. 10 to 14, the embodiment depicted in FIG. 15 may be used to reduce the contact angle of immersion liquid at the advancing side of the projection system by use of the electro wetting effect. Therefore, a combination of a liquid having a higher static contact angle and a higher velocity may be used without risking the resultant contact angle at the advancing side becoming unacceptably high. For example, with unacceptably high contact angle, an overrun of the meniscus with the ensuing risk of bubble entrapment within the immersion liquid may be caused. At the same time, the contact angle at the receding side may be ensured to remain sufficiently high to reduce the risk of loss of immersion liquid at the receding side.

As depicted in FIG. 15, a first electrode 91 is provided to a barrier member 93 that defines in part a space within which immersion liquid is provided between the projection system 94 and the upper surface of the substrate table 95 or the surface of the substrate 96. The first electrode 91 is configured to be in electrical contact with the immersion liquid within the space defined in part by the barrier member 93. A plurality of second electrodes 92 are provided to the substrate table 95 and are electrically isolated from each other and from the immersion liquid.

As shown in FIG. 15, the second electrodes 92 may be isolated from each other and from the immersion liquid by a layer 95a of electrically insulating material on the surface of the substrate table 95. Alternatively or additionally, the electrical isolation of the second electrodes 92 from the immersion liquid may be provided by the placement of the substrate 96 on top of the substrate table 95.

As shown in FIG. 15, the provision of a single first electrode 91 in electrical contact with the immersion liquid may be sufficient. However, additional first electrodes may be provided in electrical contact with the immersion liquid.

A voltage controller 97 is provided and is connected to the first electrode 91 and the second electrodes 92. The voltage controller 97 is configured such that it may provide a voltage difference between the first electrode 91 and each of the second electrodes 92 in order to provide electro wetting of the immersion liquid. In particular, the voltage controller 97 may be configured such that it can control the voltage difference between the first electrode 91 and each of the second electrodes 92 to provide different voltage differences for each of the second electrodes 92 or for groups of the second electrodes 92. The voltage controller may be used to control at which of the second electrodes 92, and to what extent, electro wetting is provided.

For example, the voltage controller 97 may be configured such that when the substrate table 95 is moved relative to the projection system 94, a voltage difference is established between the first electrode 91 and one or more second electrodes 92 in the region of the meniscus formed around the immersion liquid between the barrier member 93 and the substrate 96 or substrate table 95, on the advancing side. As explained in detail in relation to the previous embodiment, the use of electro wetting on the advancing side enables the use of a combination of immersion liquid having a higher static contact angle and a higher velocity of movement of the substrate table 95 relative to the projection system 94. This may be achieved without risking the resultant contact angle at the advancing side becoming unacceptably high, for example causing an overrun of the meniscus with the ensuing risk of bubble entrapment within the immersion liquid. By permitting the use of an immersion liquid with a higher static contact angle, it is possible to help ensure that the resulting contact angle at the receding side remains sufficiently high, reducing the likelihood of loss of immersion liquid at the receding side.

Figure 16:
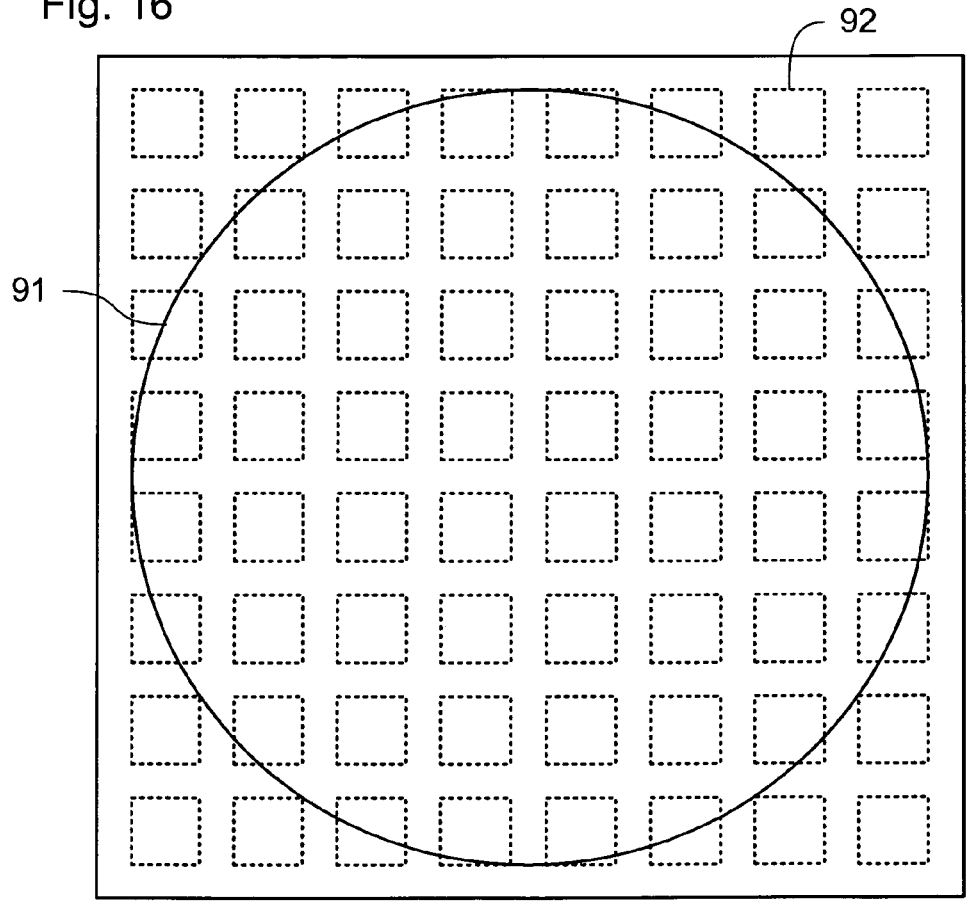

It will be appreciated that the plurality of second electrodes 92 may be arranged in a variety of different fashions. However, in one example, depicted in FIG. 16, the second electrodes may be provided as an array of second electrodes 92, covering the surface of the substrate table 95 in a plurality of rows and columns.

It should further be appreciated that the voltage controller 97 may be provided with any of a plurality of systems to control the voltage difference between the first electrode 91 and each of the second electrodes 92.

For example, a separate voltage line may be provided between the voltage controller 97 and each of the second electrodes 92 in order to directly provide the desired voltage difference between the first electrode 91 and the respective second electrode 92.

Additionally or alternatively, as depicted in FIG. 15, each of the second electrodes 92 may be associated with a switch 98 that is controlled by the voltage controller 97 in order to selectively connect each of the second electrodes 92 to a common voltage line 99 that provides a voltage difference between the first electrode 91 and a second electrode 92 when it is connected to the common voltage line 99. A separate control line may be provided between each of the switches 98 and the controller 97. Alternatively or additionally, matrix addressing may be used in order to control the switching of the switches 98.

Figure 17:
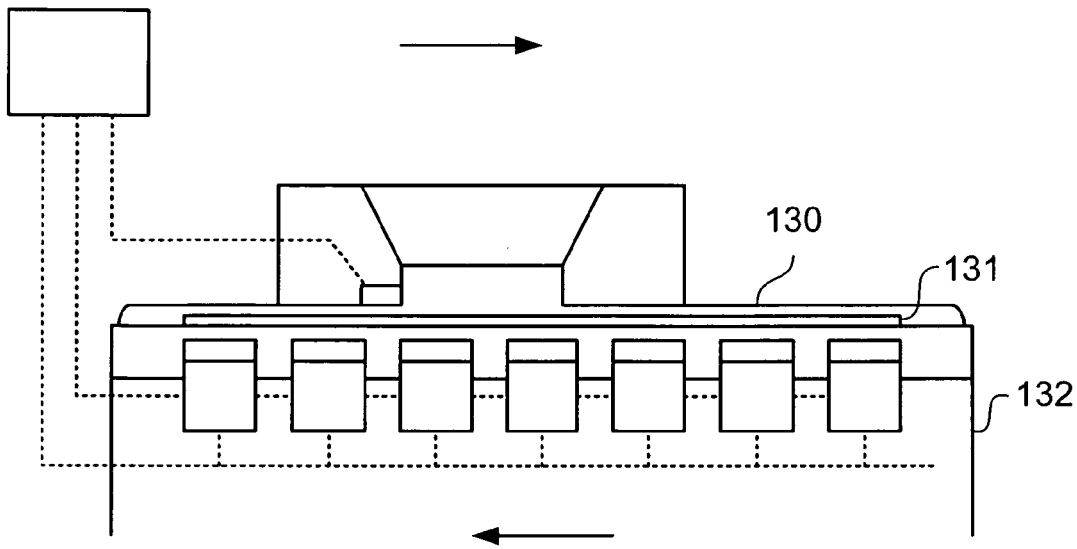
FIGS. 17 and 18 depict a further application of an embodiment of the present invention as depicted in FIGS. 15 and 16.
Figure 18:
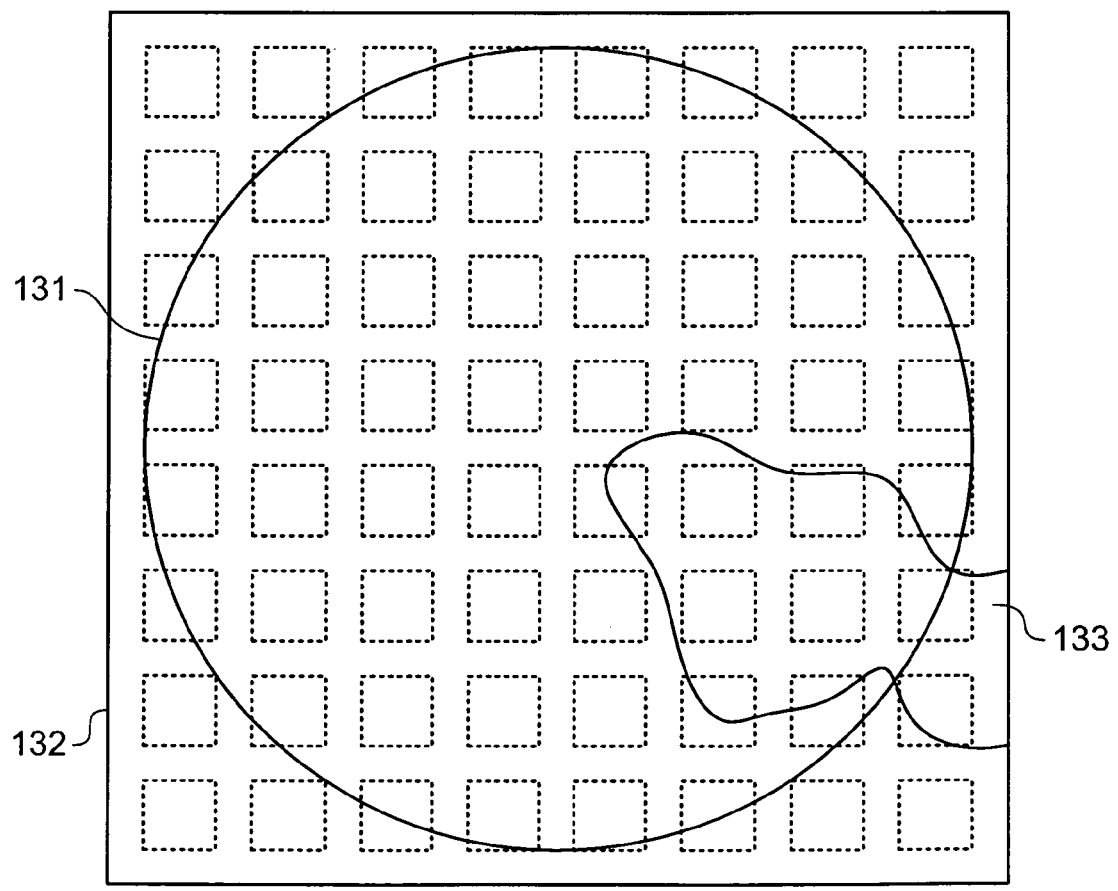

Although the embodiment depicted in FIG. 15 has been described with reference to its application to immersion lithography using a localized liquid supply system, it may be used for immersion lithography having an unconfined liquid supply system, as explained above. In such an arrangement, as depicted in FIG. 17, a relatively thin layer of immersion liquid 130 may be retained across the surface of the substrate 131 and all or part of the substrate table 132. However, as depicted in plan view in FIG. 18, there can be a problem of dry areas 133 forming on the substrate 131 or substrate table 132. The immersion liquid control system of this embodiment may therefore be used to improve an immersion lithography system having an unconfined liquid supply system.

In particular, by providing a voltage difference between the first electrode 91, namely the electrode in electrical contact with the immersion liquid, and one or more of the second electrodes 92 on the substrate table in a region in which drying may occur, the electro wetting effect may reduce the contact angle of the immersion liquid, reducing the likelihood of drying occurring. In effect, the application of a voltage difference between the first electrode and one or more of the second electrodes improves the wetting of the surface of the substrate 131, the substrate table 132, or both. Accordingly, the voltage control system may be configured such that it provides a voltage difference between the first electrode and one or more second electrodes in a region of the substrate and/or substrate table known to be prone to drying. For example, the voltage control system may be provided with a memory that stores one or more locations on the substrate or substrate table at which drying has previously occurred.

In each of the embodiments of the present intention discussed above, reference has been made to the provision of an insulating or electrically non-conducting material. Such a material must be one which provides sufficient resistance to the flow of an electrical current that a voltage difference can be maintained across it that is sufficient to induce an electro wetting effect. In addition, the material should be one that does not have any deleterious effects when used within an immersion lithographic apparatus. In particular, it must be useable in contact with the immersion liquid. Desirably, the insulating material should be made as thin as possible while providing sufficient electrical resistance. In general, a ceramic and/or a polymer may be suitable. Particularly suitable materials for use as the insulating material include quartz and silicon oxide. In embodiments in which it is desirable for the substrate to be covered with an insulating layer, an electrically isolating top coat may be formed on the resist.

In addition, it should be appreciated that for each of the embodiments of the present invention discussed above, the immersion liquid used should be sufficiently electrically conductive that there is not a significant voltage drop between an electrode that is in contact with the immersion liquid and the portion of an immersion liquid that is adjacent an isolated electrode and at which an electro wetting effect is desired. For example, an aqueous solution may be used for the immersion liquid, in particular a dilute aqueous solution formed by dissolving carbon dioxide in water may be used. As a further example, the liquid may be a fluid suitable for high NA lithography, for example it may be an organic fluid. Such a fluid may include an electrically responsive additive, that will position itself with respect to one or more generated electrical fields.

The voltage controller of the embodiments of the present invention may provide a d.c. voltage difference between the appropriate electrodes to provide the electro wetting effect. Alternatively, the voltage controller may provide an a.c. voltage difference which may beneficially reduce hysteresis, enabling easier initiation of the electro wetting effect. The voltage difference provided by the voltage controller may be a combination of these, namely an a.c. voltage difference with a d.c. offset.

In some of the embodiments described above, the electrode exposed to the liquid was shown on one surface and the electrode covered by an insulating material was shown on another surface. In an embodiment, where appropriate, the locations of the electrode may switched between the surfaces.

In an embodiment, the electrodes may be combined with a liquidphilic or liquidphobic material on a surface to provide desired contact angles for, for example, a receding side and advancing side.

In operation an electrode may cause the surface with which it is associated to reduce its effective contact angle, i.e. become more liquidphilic for example approach zero degrees when fully operating. When the electrode is not operating, the associated surface has a contact angle according to its surface properties (for example by having a liquidphobic coating). The surface properties and the electrode when fully operating may determine the maximum and minimum effective contact angles of the associated surface, i.e. the range of the effective contact angle of the associated surface. Operation of the electrode may allow the associated surface to achieve a minimum effective contact angle, for example 20, 10 or zero degrees when fully operating or an effective contact angle which is between the effective contact angle of the associated surface when the electrode is not in operation and when fully operating. Controlling the operation of the electrode may allow control of the effective contact angle of the associated surface. Control of the electrode may facilitate improved control of liquid on the effective surface, for example the liquid's meniscus.

To determine the extent of control of the effective contact angle, and of liquid on the effective surface, the associated surface may be selected to have a specific contact angle according to its surface properties (i.e. without operation of the electrode). Therefore to maximize the effective contact angle range it is desirable for the surface to have a coating which is liquidphobic, desirably highly liquidphobic, for example approaching 180 degrees. Full operation of the electrode would achieve a minimum contact angle, which may be zero degrees. An associated surface with surface properties which have a contact angle of 180 degrees can have the maximum achievable range of effective contact angle. For some surfaces it may desirable to limit the contact angle, for example a surface may have a contact angle of 90 degrees according to its surface properties. The range of effective contact angle for such a surface may be zero to 90 degrees.

The use of a combination of an electrode for electro-wetting with a liquidphobic associated surface is desirable for a surface of an immersion system so as to control, or at lease improve the control, of immersion liquid movement. Such a surface may include: a sensor; the surface of a lens in contact with immersion liquid; a surface associated with a gap in the surface of the substrate table WT, for example between the edge of a substrate W and the substrate table WT; and/or the surface of a liquid confinement structure, such as an undersurface of the liquid confinement structure or a surface of the liquid confinement structure which faces the projection system. Such a surface of the liquid confinement structure in use would be in contact with a meniscus of immersion liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a submerged bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. The immersion system may comprise an immersion liquid confinement structure for confining the immersion liquid to a space between a projection system and a substrate table, and the immersion liquid confinement structure.

In an embodiment, there is provided an immersion lithographic apparatus comprising: a surface that at least periodically is in contact with an immersion liquid; and an active immersion liquid control system. The active immersion liquid control system comprises a first electrode, a second electrode and a voltage controller. The first electrode is electrically connectable to immersion liquid to be controlled on the surface. The second electrode is associated with the surface and electrically isolated from immersion liquid on the surface. The voltage controller is configured to provide a controlled voltage difference between the first and second electrodes.

The surface may be a surface of a porous member of an extractor. At least a part of the porous member may be used as one of the first or second electrodes. The porous member may comprise a core formed of: electrically conducting material that forms the second electrode, and a coating of electrically insulating material. The coating may be formed from quartz or silicon oxide. The first electrode may be electrically connectable to immersion liquid on a side of the porous member to which immersion liquid is extracted by the extractor.

The active immersion liquid control system may comprise: a plurality of the first electrodes and a plurality of the second electrodes. The plurality of first electrodes may be arranged on the surface such that a droplet of the immersion liquid on the surface may be electrically connected to at least one of the first electrodes. The plurality of second electrodes may be arranged on the surface such that any droplets of the immersion liquid on the surface are electrically isolated from the second electrodes. The plurality of second electrodes may be coated by an electrically insulating material. The coating may be formed from quartz or silicon oxide.

The apparatus may be configured to provide a voltage difference between the first electrodes and the second electrodes that results in electro wetting of droplets of the immersion liquid on the surface that are in contact with at least one of the first electrodes such that each droplet spreads out on the surface. The apparatus may comprise a liquid extraction system configured to extract liquid from the surface.

The active immersion liquid control system may be configured to control immersion liquid on at least one surface selected from the following surfaces: a surface of a projection system of the immersion lithographic apparatus, configured to project a patterned beam of radiation onto a substrate; a surface of a substrate table, configured to support the substrate; and a surface of an immersion system, configured to supply immersion liquid to a space between a final element of the projection system and the substrate.

The apparatus may comprise a substrate table configured to hold a substrate, the substrate table comprising the second electrode. The surface that is at least periodically in contact with an immersion liquid may be a surface of the substrate table, a surface of a substrate when it is supported by the substrate table, or both the substrate table and substrate surfaces. The substrate table may comprise a plurality of the second electrodes. The second electrodes may be electrically isolated from each other and from the immersion liquid on the surface. The voltage controller may be configured to independently control the voltage difference between the first electrode and each of the second electrodes.

The apparatus may further comprise a projection system, and a barrier member. The projection system may be configured to project a patterned beam of radiation onto the substrate. The barrier member may be configured to at least partly contain liquid in a space between the projection system and the substrate or substrate table, the barrier member configured such that there is a separation between the barrier member and the substrate or substrate table in which a meniscus, that surrounds the space, forms between the liquid and surrounding gas when the liquid is in the space. The voltage controller may be configured such that, when there is relative movement between the substrate table and the projection system towards a region of the meniscus, a voltage difference is provided between the first electrode and a second electrode adjacent the region of the meniscus.

The barrier member may comprise the first electrode. The first electrode may be configured to be electrically connected to liquid within the space between the projection system and the substrate or substrate table.

The apparatus may be configured such that, in use, substantially an entire major face of the substrate is coated with immersion liquid. The voltage controller may be configured to provide a voltage difference between the first electrode and a second electrode associated with a region of the substrate, of the substrate table, or of both the substrate and the substrate table, considered to be at risk of forming a dry area.

The second electrode may be on or at the surface of the substrate table and coated with a coating of electrically insulating material. The second electrode may be in the form of an array of second electrodes, each of the second electrodes associated with a switch, the switch configured to connect that second electrode to a voltage source to establish a voltage difference between that second electrode and the first electrode. The voltage controller may comprise a switch control system configured to control switches associated with the second electrodes by matrix addressing.

The immersion liquid may be electrically conductive. The immersion liquid may be a dilute aqueous solution. The voltage controller may be configured to provide an a.c. voltage between the first and second electrodes. The voltage controller may be configured to provide a d.c. component between the first and second electrodes.

In an embodiment, there is provided a device manufacturing method, comprising: supporting a substrate on a substrate table; projecting a patterned beam of radiation onto the substrate using a projection system; supplying immersion liquid, using an immersion system, to a space between the projection system and the substrate or substrate table; controlling immersion liquid on at least one surface selected from the following surfaces: a surface of the projection system, a surface of the substrate table and a surface of the immersion system, by applying a controlled voltage between a first electrode, electrically connected to the immersion liquid to be controlled, and a second electrode, associated with the surface and electrically isolated from the immersion liquid to be controlled.

In an embodiment, there is provided an immersion lithographic apparatus comprising: a substrate table, a projection system, a barrier member and a voltage controller. The substrate table is configured to hold a substrate, wherein the substrate, the substrate table, or both the substrate and the substrate table, is coated with a layer of an electrically insulating material. The projection system is configured to project a patterned beam of radiation onto the substrate. The barrier member is configured to at least partly contain liquid in a space between the projection system and the substrate or substrate table, the barrier member configured such that there is a separation between the barrier member and the substrate or substrate table in which a meniscus, that surrounds the space, forms between the liquid and surrounding gas when the liquid is in the space, and the barrier member comprises an electrode arranged to be in electrical contact with the liquid adjacent a region of the meniscus. The voltage controller is configured to provide a controlled voltage difference between the electrode and the substrate, the substrate table, or both the substrate and the substrate table, when there is relative movement between the substrate table and the projection system in a direction that is substantially toward the region of the meniscus.

The barrier member may comprise a plurality of electrodes, each in electrical contact with the liquid adjacent a respective region of the meniscus. The voltage controller may be configured to independently control a voltage difference provided between each of the electrodes and the substrate, the substrate table, or both the substrate and the substrate table. The barrier member may comprise at least four, at least six, or at least eight electrodes, evenly distributed around the meniscus. The electrodes may be on a surface of the barrier member that is in contact with the liquid and are electrically isolated from each other. The barrier member may comprise a plurality of sections, each of which functions as a respective one of the electrodes and the sections are electrically isolated from each other.

The substrate table may be coated with a layer formed from quartz or silicon oxide. The substrate may be coated with an electrically non-conducting coating layer.

The voltage controller may be configured to provide, at any one instant, a voltage difference between the substrate, the substrate table, or both the substrate and the substrate table, and at most one electrode. The electrode may be adjacent the region of the meniscus that most closely corresponds to the portion of the meniscus towards which the relative movement is directed at that instant.

The voltage controller may be configured to provide, at any one instant, a voltage difference between the substrate, the substrate table, or both the substrate and the substrate table, and at most two electrodes. The electrodes may be adjacent the respective regions of the meniscus that most closely correspond to the portion of the meniscus towards which the relative movement is directed at that instant.

The substrate, the substrate table, or both the substrate and the substrate table, may be electrically connected to ground. The voltage controller may be configured to independently control a voltage difference between each electrode and ground.

The voltage controller may be configured such that, if it is not providing a voltage difference between an electrode and the substrate, the substrate table, or both the substrate and the substrate table, the voltage controller connects the electrode to ground.

The liquid may be electrically conductive. The liquid may be a dilute aqueous solution.

The voltage controller may be configured to provide an a.c. voltage between the electrode and the liquid. The voltage controller may be configured to provide a d.c. component between the electrode and the liquid.

The apparatus may comprise an actuator system configured to move the substrate table relative to the projection system.

In an embodiment, there is provided a device manufacturing method, comprising: supporting a substrate on a substrate table, wherein the substrate, the substrate table, or both the substrate and the substrate table, is coated with a layer of an electrically insulating material; projecting a patterned beam of radiation onto the substrate using a projection system; supplying liquid to a space between the projection system and the substrate or substrate table at least partly defined by a barrier member, wherein there is a space between the barrier member and the substrate, the substrate table, or both the substrate and the substrate table, in which a meniscus, that surrounds the space, forms between the liquid and surrounding gas and the barrier member comprises an electrode in electrical contact with the liquid adjacent a region of the meniscus; and providing a controlled voltage difference between the electrode and the substrate, the substrate table, or both the substrate and the substrate table, when there is relative movement between the substrate table and the projection system in a direction that is substantially towards the region of the meniscus.

The method may comprise moving the substrate table relative to the projection system.

In an embodiment, there may be provided an immersion lithographic apparatus comprising: a surface that at least periodically is in contact with an immersion liquid; and an active immersion liquid control system, configured to control the contact angle of the immersion liquid on the surface.

The active immersion liquid control system may be configured to control the contact angle by means of electro wetting.

In an embodiment, there is provided a method of controlling the behavior of a liquid on a surface within an immersion lithographic apparatus, comprising: controlling the contact angle of the liquid on the surface. The contact angle may be controlled by means of electro wetting.

The descriptions above are intended to be illustrative, not limiting. Thus, it will be apparent to one skilled in the art that modifications may be made to the invention as described without departing from the scope of the claims set out below.

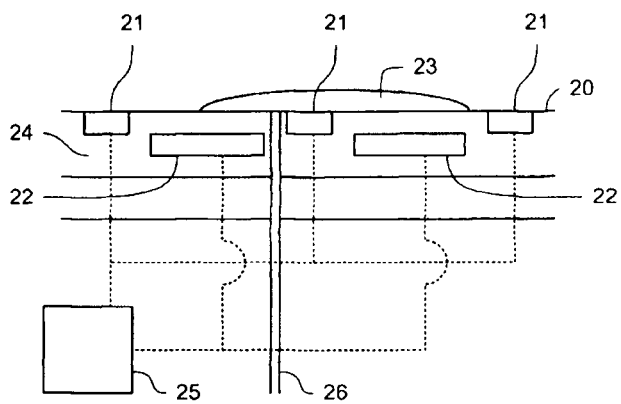

The invention claimed is:

1. An immersion lithographic apparatus comprising:
   a surface that at least periodically is in contact with an immersion liquid; and
   an active immersion liquid control system, comprising;
   a first electrode, electrically connectable to immersion liquid to be controlled on the surface,
   a second electrode, associated with the surface and electrically isolated from immersion liquid on the surface, and
   a voltage controller configured to provide a controlled voltage difference between the first and second electrodes.

2. The apparatus of claim 1, wherein the surface is a surface of a porous member of an extractor.

3. The apparatus of claim 2, wherein at least a part of the porous member is used as one of the first or second electrodes.

4. The apparatus of claim 3, wherein the porous member comprises a core formed of electrically conducting material that forms the second electrode, and a coating of electrically insulating material.

5. The apparatus of claim 4, wherein the first electrode is electrically connectable to immersion liquid on a side of the porous member to which immersion liquid is extracted by the extractor.

6. The apparatus of claim 1, wherein the active immersion liquid control system comprises: a plurality of the first electrodes, arranged on the surface such that a droplet of the immersion liquid on the surface may be electrically connected to at least one of the first electrodes; and a plurality of the second electrodes, arranged on the surface such that any droplets of the immersion liquid on the surface are electrically isolated from the second electrodes.

7. The apparatus of claim 6, configured to provide a voltage difference between the first electrodes and the second electrodes that results in electro wetting of droplets of the immersion liquid on the surface that are in contact with at least one of the first electrodes such that each droplet spreads out on the surface.

8. The apparatus of claim 6, wherein the active immersion liquid control system is configured to control immersion liquid on at least one surface selected from the following surface: a surface of a projection system of the immersion lithographic apparatus, configured to project a patterned beam of radiation onto a substrate, a surface of a substrate table, configured to support the substrate, and a surface of an immersion system, configured to supply immersion liquid to a space between a final element of the projection system and the substrate.

9. The apparatus of claim 1, further comprising a substrate table configured to hold a substrate, the substrate table comprising the second electrode, and wherein the surface that is at least periodically in contact with an immersion liquid is a surface of the substrate table, a surface of a substrate when it is supported by the substrate table, or both the substrate table and substrate surfaces.

10. The apparatus of claim 9, wherein the substrate table comprises a plurality of the second electrodes, the second electrodes electrically isolated from each other and from the immersion liquid on the surface, and the voltage controller is configured to independently control the voltage difference between the first electrode and each of the second electrodes.

11. The apparatus of claim 9, configured such that, in use, substantially an entire major face of the substrate is coated with immersion liquid, and wherein the voltage controller is configured to provide a voltage difference between the first electrode and a second electrode associated with a region of the substrate, of the substrate table, or of both the substrate and the substrate table, considered to be at risk of forming a dry area.

12. The apparatus of claim 9, wherein the second electrode is on or at the surface of the substrate table and coated with a coating of electrically insulating material.

13. The apparatus of claim 1, wherein the immersion liquid is electrically conductive.

14. The apparatus of claim 1, wherein the voltage controller is configured to provide an a.c. voltage between the first and second electrodes.

15. A device manufacturing method, comprising:
   supporting a substrate on a substrate table;
   projecting a patterned beam of radiation onto the substrate using a projection system;
   supplying immersion liquid, using an immersion system, to a space between the projection system and the substrate or substrate table;
   controlling immersion liquid on at least one surface selected from the following surfaces: a surface of the projection system, a surface of the substrate table and a surface of the immersion system, by applying a controlled voltage between a first electrode, electrically connected to the immersion liquid to be controlled, and a second electrode, associated with the surface and electrically isolated from the immersion liquid to be controlled.

16. An immersion lithographic apparatus comprising:
   a substrate table configured to hold a substrate, wherein the substrate, the substrate table, or both the substrate and the substrate table, is coated with a layer of an electrically insulating material;
   a projection system configured to project a patterned beam of radiation onto the substrate;
   a barrier member configured to at least partly contain liquid in a space between the projection system and the substrate or substrate table, the barrier member configured such that there is a separation between the barrier member and the substrate or substrate table in which a meniscus, that surrounds the space, forms between the liquid and surrounding gas when the liquid is in the space, and the barrier member comprises an electrode arranged to be in electrical contact with the liquid adjacent a region of the meniscus; and
   a voltage controller configured to provide a controlled voltage difference between the electrode and the substrate, the substrate table, or both the substrate and the substrate table, when there is relative movement between the substrate table and the projection system in a direction that is substantially toward the region of the meniscus.

17. A device manufacturing method, comprising:
   supporting a substrate on a substrate table, wherein the substrate, the substrate table, or both the substrate and the substrate table, is coated with a layer of an electrically insulating material;
   projecting a patterned beam of radiation onto the substrate using a projection system;
   supplying liquid to a space between the projection system and the substrate or substrate table at least partly defined by a barrier member, wherein there is a space between the barrier member and the substrate, the substrate table, or both the substrate and the substrate table, in which a meniscus, that surrounds the space, forms between the liquid and surrounding gas and the barrier member comprises an electrode in electrical contact with the liquid adjacent a region of the meniscus; and providing a controlled voltage difference between the electrode and the substrate, the substrate table, or both the substrate and the substrate table, when there is relative movement between the substrate table and the projection system in a direction that is substantially towards the region of the meniscus.

18. An immersion lithographic apparatus comprising:

a surface that at least periodically is in contact with an immersion liquid; and an active immersion liquid control system, configured to control the contact angle of the immersion liquid on the surface in-situ of the immersion lithographic apparatus.

19. A method of controlling the behavior of a liquid on a surface within an immersion lithographic apparatus, comprising:

controlling the contact angle of the liquid on the surface in-situ of the immersion lithographic apparatus.

* * * * *

UNITED STATES PATENT AND TRADEMARK OFFICE
CERTIFICATE OF CORRECTION

PATENT NO. : 8,149,379 B2
APPLICATION NO. : 12/292961
DATED : April 3, 2012
INVENTOR(S) : Sjoerd Nicolaas Lambertus Donders et al.

It is certified that error appears in the above-identified patent and that said Letters Patent is hereby corrected as shown below:

Delete title page and substitute the attached title page therefor.

On title page, after item (57) ABSTRACT
       replace "19 Claims, 9 Drawing Sheets"
       with --20 Claims, 9 Drawing Sheets--.

In the claims, Column 30, line 10
       add --20. The apparatus of claim 4, wherein the surface has a contact angle of less than or equal to
          90° with the immersion liquid.--.

Signed and Sealed this
Nineteenth Day of June, 2012

David J. Kappos
*Director of the United States Patent and Trademark Office*

(12) United States Patent
Donders et al.

(10) Patent No.: US 8,149,379 B2
(45) Date of Patent: Apr. 3, 2012

(54) LITHOGRAPHIC APPARATUS AND DEVICE MANUFACTURING METHOD

(75) Inventors: Sjoerd Nicolaas Lambertus Donders, Vught (NL); Nicolaas Ten Kate, Almkerk (NL); Lucas Henricus Johannes Stevens, Eindhoven (NL); Ronald Van Der Ham, Maarheeze (NL); Michel Riepen, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 546 days.

(21) Appl. No.: 12/292,961

(22) Filed: Dec. 1, 2008

(65) Prior Publication Data
US 2009/0161083 A1 Jun. 25, 2009

Related U.S. Application Data

(60) Provisional application No. 60/996,740, filed on Dec. 3, 2007, provisional application No. 61/006,027, filed on Dec. 14, 2007, provisional application No. 61/129,154, filed on Jun. 6, 2008.

(51) Int. Cl.
*G03B 27/52* (2006.01)
*G03B 27/32* (2006.01)

(52) U.S. Cl. .......................... 355/30; 355/77
(58) Field of Classification Search ............ 355/30
See application file for complete search history.

(56) References Cited

U.S. PATENT DOCUMENTS

| | | | |
|---|---|---|---|
| 4,283,730 A * | 8/1981 | Graf | 347/82 |
| 4,509,852 A | 4/1985 | Tabarelli et al. | |
| 6,949,176 B2 * | 9/2005 | Vacca et al. | 204/547 |
| 7,050,146 B2 | 5/2006 | Duineveld et al. | |
| 7,125,652 B2 | 10/2006 | Lyons et al. | |
| 7,317,504 B2 | 1/2008 | De Smit et al. | |
| 7,339,650 B2 | 3/2008 | Coon et al. | |
| 7,692,761 B2 | 4/2010 | Harayama | |
| 7,701,550 B2 | 4/2010 | Kemper et al. | |
| 7,705,962 B2 | 4/2010 | Kemper et al. | |
| 7,839,483 B2 | 11/2010 | Leenders et al. | |
| 2003/0205632 A1 * | 11/2003 | Kim et al. | 239/690 |
| 2004/0136494 A1 | 7/2004 | Lof et al. | |
| 2004/0160582 A1 | 8/2004 | Lof et al. | |
| 2004/0207824 A1 | 10/2004 | Lof et al. | |
| 2006/0023184 A1 * | 2/2006 | Coon et al. | 355/53 |
| 2006/0023187 A1 | 2/2006 | Eaton | |
| 2007/0109521 A1 | 5/2007 | Nishii et al. | |
| 2007/0146666 A1 | 6/2007 | Leenders et al. | |
| 2008/0002163 A1 | 1/2008 | Fujiwara et al. | |
| 2008/0117393 A1 | 5/2008 | Fujiwara et al. | |

(Continued)

FOREIGN PATENT DOCUMENTS
EP 1 420 300 A2 5/2004
(Continued)

OTHER PUBLICATIONS

Korean Office Action dated Oct. 27, 2010 in related Korean patent application No. 10-2008-0121261.

(Continued)

*Primary Examiner* — Edward Glick
*Assistant Examiner* — Michelle Iacoletti
(74) *Attorney, Agent, or Firm* — Pillsbury Winthrop Shaw Pittman LLP

(57) ABSTRACT

The use of electro wetting to control the behavior of immersion liquid within an immersion lithographic apparatus is disclosed.

20 Claims, 9 Drawing Sheets